(12) United States Patent
Dong et al.

(10) Patent No.: US 11,625,132 B2
(45) Date of Patent: Apr. 11, 2023

(54) TOUCH PAD AND METHOD FOR MANUFACTURING THE SAME, TOUCH DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Zhao Dong, Beijing (CN); Bisheng Li, Beijing (CN); Baoran Li, Beijing (CN); Le Li, Beijing (CN); Qidi Wu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/491,144

(22) Filed: Sep. 30, 2021

(65) Prior Publication Data
US 2022/0147188 A1    May 12, 2022

(30) Foreign Application Priority Data

Nov. 10, 2020 (CN) .......................... 202011249849.4

(51) Int. Cl.
*G06F 3/044* (2006.01)
*H01L 27/32* (2006.01)

(52) U.S. Cl.
CPC .......... *G06F 3/0446* (2019.05); *G06F 3/0445* (2019.05); *H01L 27/323* (2013.01); *G06F 2203/04103* (2013.01)

(58) Field of Classification Search
CPC ................. G06F 3/0446; G06F 3/0445; G06F 2203/04103; G06F 2203/04112; G06F 3/04164; H01L 27/323
See application file for complete search history.

(56) References Cited

U.S. PATENT DOCUMENTS

| | | | |
|---|---|---|---|
| 2012/0228106 A1* | 9/2012 | Horino | G02F 1/13452 29/829 |
| 2013/0106726 A1* | 5/2013 | Ho | G06F 3/0446 345/173 |
| 2013/0147730 A1* | 6/2013 | Chien | G06F 3/0446 345/173 |

(Continued)

FOREIGN PATENT DOCUMENTS

WO  WO 2018/059111 A1 * 2/2018

*Primary Examiner* — Md Saiful A Siddiqui
(74) *Attorney, Agent, or Firm* — IP & T Group LLP

(57) ABSTRACT

A touch pad includes a first conductive pattern layer, a second conductive pattern layer, a first trace, a second trace, a first bonding pad, and a second bonding pad. The first conductive pattern layer includes a first touch electrode extending in a first direction. The second conductive pattern layer includes a second touch electrode extending in a second direction. A first end of the first trace is coupled to the first touch electrode, and a second end of the first trace is coupled to the first bonding pad. A first end of the second trace is coupled to the second touch electrode, and a second end of the second trace is coupled to the second bonding pad. The first direction intersects the second direction.

18 Claims, 14 Drawing Sheets

(56) References Cited

U.S. PATENT DOCUMENTS

| | | | |
|---|---|---|---|
| 2013/0278513 A1* | 10/2013 | Jang | G06F 3/0445 |
| | | | 345/173 |
| 2015/0145807 A1* | 5/2015 | Wang | G06F 3/04164 |
| | | | 216/13 |
| 2016/0103548 A1* | 4/2016 | Jun | G06F 3/0412 |
| | | | 345/173 |
| 2019/0354240 A1* | 11/2019 | Wang | G06F 3/0446 |
| 2020/0326791 A1* | 10/2020 | Wang | G06F 3/041 |

* cited by examiner

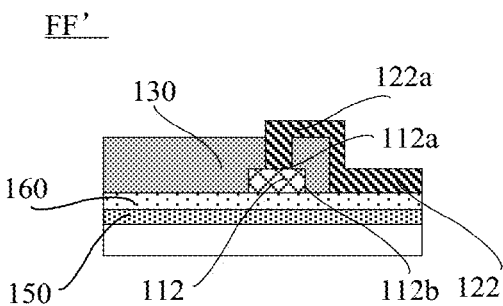
FIG. 15
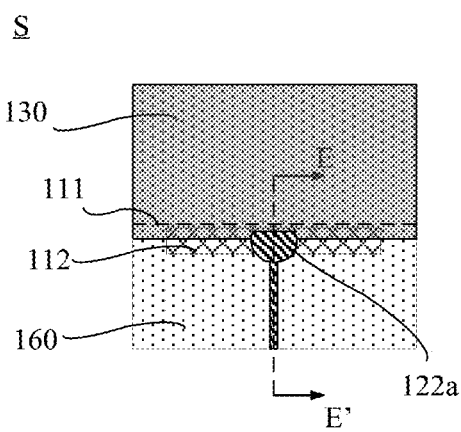
FIG. 16
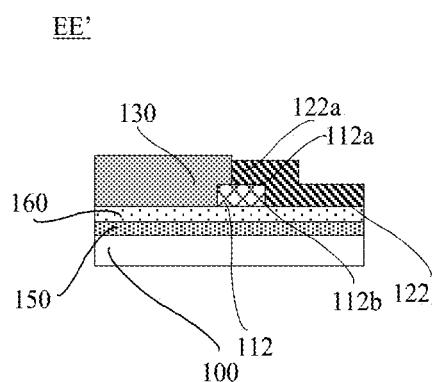 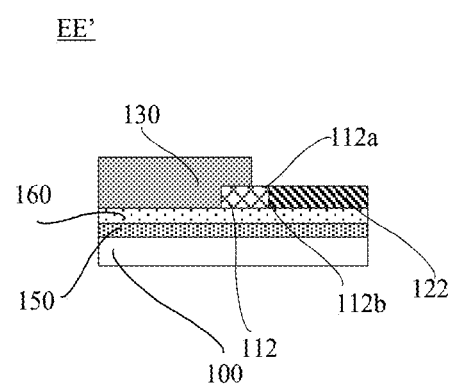
FIG. 17A          FIG. 17B

S101

S102

S103

S104

S105

S106

TOUCH PAD AND METHOD FOR MANUFACTURING THE SAME, TOUCH DISPLAY DEVICE

CROSS-REFERENCE TO RELATED APPLICATION

This application claims priority to Chinese Patent Application No. 202011249849.4, filed on Nov. 10, 2020, which is incorporated herein by reference in its entirety.

TECHNICAL FIELD

The present disclosure relates to the field of display technologies, and in particular, to a touch pad and a method for manufacturing the same, and a touch display device.

BACKGROUND

With the advancement of modern touch technology, the application range of touch screens continues to expand, with touch screens becoming the standard configuration in mobile phones and tablet computers. Common capacitive touch screens have the advantages of high light transmittance, quick response, and long service life. As a mainstream capacitive touch screen, On-Glass-Metal (OGM, metal mesh integration) type touch screen has higher sensitivity and supports narrow bezel design and handwriting, and is therefore favored by the middle to high-end touch market.

SUMMARY

In one aspect, a touch pad is provided. The touch pad includes a first conductive pattern layer, a second conductive pattern layer, a first trace, a second trace, a first bonding pad, a second bonding pad and a first insulating layer. The first trace, the second trace, the first bonding pad and the second bonding pad are located in the first conductive pattern layer or in the second conductive pattern layer. The first conductive pattern layer includes a first touch electrode extending in a first direction. The second conductive pattern layer includes a second touch electrode extending in a second direction. A first end of the first trace is coupled to the first touch electrode, and a second end of the first trace is coupled to the first bonding pad. A first end of the second trace is coupled to the second touch electrode, and a second end of the second trace is coupled to the second bonding pad. The first insulating layer is located between the first conductive pattern layer and the second conductive pattern layer, and is configured to insulate the first touch electrode and the second touch electrode from each other. The first direction intersects the second direction.

In some embodiments, a material of the first conductive pattern layer is different from a material of the second conductive pattern layer.

In some embodiments, the first conductive pattern layer further includes a first connection pad. The first connection pad is located at an end of the first touch electrode, and the first end of the first trace is coupled to the first touch electrode through the first connection pad. The second conductive pattern layer further includes a second connection pad. The second connection pad is located at an end of the second touch electrode, and the first end of the second trace is coupled to the second touch electrode through the second connection pad.

In some embodiments, an orthographic projection of a whole formed by the first touch electrode and the second touch electrode on the first insulating layer is located within the first insulating layer. The first insulating layer has a first edge and second edges, the second edges being remaining edges of the first insulating layer except for the first edge. The first edge is located between an orthographic projection of a whole formed by the first bonding pad and the second bonding pad on the first insulating layer and an orthographic projection of the whole formed by the first touch electrode and the second touch electrode on the first insulating layer. Or, the first edge coincides with an edge of the whole formed by the first touch electrode and the second touch electrode proximate to the whole formed by the first bonding pad and the second bonding pad.

In some embodiments, in a case where the first edge is located between the orthographic projection of the whole formed by the first bonding pad and the second bonding pad on the first insulating layer and the orthographic projection of the whole formed by the first touch electrode and the second touch electrode on the first insulating layer, an orthographic projection of the first connection pad on the first insulating layer is located within the first insulating layer. A via hole is provided in the first insulating layer, and the first end of the first trace is coupled to a surface of the first connection pad exposed from the via hole through the via hole.

In some embodiments, the first connection pad includes a top surface proximate to the first insulating layer and a side surface connected to the top surface. The top surface is exposed from the via hole, and the first end of the first trace is coupled to the top surface.

In some embodiments, in a case where the first edge coincides with the edge of the whole formed by the first touch electrode and the second touch electrode proximate to the whole formed by the first bonding pad and the second bonding pad, an orthographic projection of first connection pad on the first insulating layer partially overlaps with the first insulating layer, and a portion of the first connection pad is exposed outside of the first insulating layer. The first end of the first trace is coupled with the portion of the first connection pad that is exposed.

In some embodiments, the first connection pad includes a top surface proximate to the first insulating layer and a side surface connected to the top surface. The side surface is exposed outside of the first insulating layer, and the first end of the first trace is coupled to the side surface; or, the side surface and at least a portion of the top surface are exposed outside of the first insulating layer, and the first end of the first trace is coupled to the side surface and the portion of the top surface that are exposed.

In some embodiments, the second conductive pattern layer further includes a third connection pad. One end of the third connection pad is coupled to the first end of the first trace, and another end of the third connection pad is coupled to the side surface that is exposed; or, one end of the third connection pad is coupled to the first end of the first trace, and another end of the third connection pad is coupled to the side surface and the portion of the top surface that are exposed.

In some embodiments, the touch pad further includes a second insulating layer. The second insulating layer is located on a side of the second conductive pattern layer away from the first conductive pattern layer. A first opening is provided in the second insulating layer, and the first opening exposes the first bonding pad and the second bonding pad.

In some embodiments, the touch pad further includes a third insulating layer. The third insulating layer is located on a side of the first conductive pattern layer away from the second conductive pattern layer. A third opening is provided in the third insulating layer, and the third opening exposes the first bonding pad and the second bonding pad. An orthographic projection of the third insulating layer on the first insulating layer coincides with an orthographic projection of the second insulating layer on the first insulating layer.

In some embodiments, the touch pad further includes a light-shielding layer. The light-shielding layer is located on a side of the third insulating layer away from the first conductive pattern layer. A second opening is provided in the light-shielding layer, and an orthographic projection of the first touch electrode on the light-shielding layer and an orthographic projection of the second touch electrode on the light-shielding layer both overlap with the second opening.

In some embodiments, a contour line of the orthographic projection of the first touch electrode on the light-shielding layer exceeds beyond the second opening by 0.5 mm to 4 mm in the first direction. A contour line of the orthographic projection of the second touch electrode on the light-shielding layer exceeds beyond the second opening by 0.5 mm to 4 mm in the second direction.

In some embodiments, the first touch electrode includes a plurality of first touch electrode lines and a plurality of second touch electrode lines. The plurality of first touch electrode lines and the plurality of second touch electrode lines intersect to form the first touch electrode having a plurality of openings. The second touch electrode includes a plurality of first touch electrode lines and a plurality of second touch electrode lines. The plurality of first touch electrode lines and the plurality of second touch electrode lines intersect to form the second touch electrode having a plurality of openings.

In some embodiments, the first conductive pattern layer includes a first metal layer and a first blackened layer that are stacked, and the first blackened layer is located on a side of the first metal layer proximate to a touch surface of the touch pad. And/or, the second conductive pattern layer includes a second metal layer and a second blackened layer that are stacked, and the second blackened layer is located on a side of the second metal layer proximate to the touch surface of the touch pad.

In some embodiments, the touch panel further includes a base substrate. The first conductive pattern layer, the second conductive pattern layer and the first insulating layer are all located on the base substrate. The first conductive pattern layer is more proximate to the base substrate than the second conductive pattern layer.

In some embodiments, the first insulating layer has a first edge and second edges, the second edges being remaining edges of the first insulating layer except for the first edge. A first distance exists between the second edge and a corresponding edge of the base substrate, or, the second edge coincides with a corresponding edge of the base substrate. The second edge is located outside a contour line of the orthographic projection of the whole formed by the first touch electrode and the second touch electrode on the first insulating layer, and a second distance exists between the second edge and the contour line.

In some embodiments, the second distance is in a range of 0.5 mm to 4 mm.

In another aspect, a touch display device is provided. The touch display device includes a display panel and the touch pad as described above.

In still another aspect, a method for manufacturing a touch pad is provided. The method includes: forming a first conductive pattern layer, the first conductive pattern layer including a first touch electrode extending in a first direction; forming a second conductive pattern layer, the second conductive pattern layer including a second touch electrode extending in a second direction; forming a first trace, a second trace, a first bonding pad and a second bonding pad in the first conductive pattern layer or in the second conductive pattern layer; and forming a first insulating layer between the first conductive pattern layer and the second conductive pattern layer, the first insulating layer being configured to insulate the first touch electrode and the second touch electrode from each other. The first direction intersects the second direction. A first end of the first trace is coupled to the first touch electrode, and a second end of the first trace is coupled to the first bonding pad. A first end of the second trace is coupled to the second touch electrode, and a second end of the second trace is coupled to the second bonding pad.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

FIG. 15 is a cross-sectional view of the region S shown in FIG. 14 along an F-F' direction;

FIG. 16 is another structural diagram of a region S (as marked in FIG. 2), in accordance with some embodiments;

FIGS. 17A~17B are cross-sectional views of the region S shown in FIG. 16 along an E-E' direction;

DETAILED DESCRIPTION

Figure 1A:
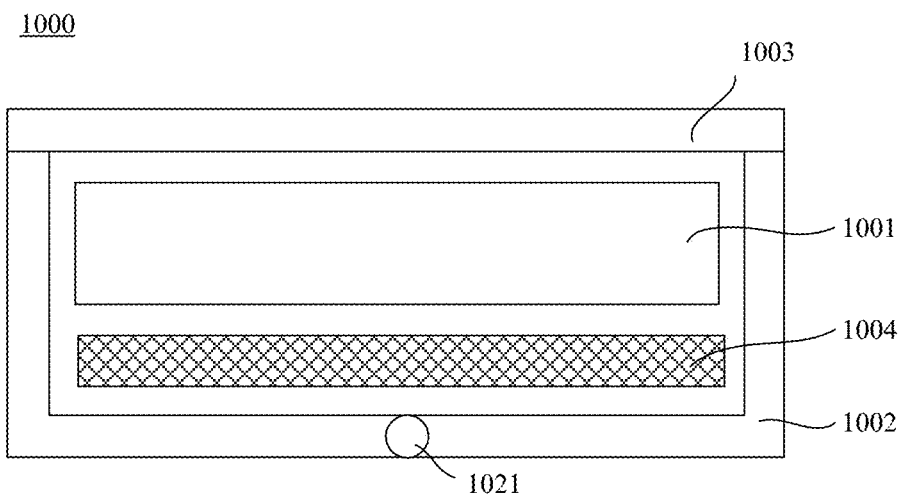
FIG. 1A is a structural diagram of a touch display device, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

In the description of the present disclosure, it will be understood that, orientations or positional relationships indicated by the terms such as "center", "upper", "lower", "front", "rear", "left", "right", "vertical", "horizontal", "top", "bottom", "inner", "outer", and the like are based on orientations or positional relationships shown in the drawings, which are merely to facilitate and simplify the description of the present disclosure, and are not to indicate or imply that the devices or elements referred to must have a particular orientation, or must be constructed or operated in a particular orientation. Therefore, they should not be construed as limitations on the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and their derivatives may be used. For example, the term "connected" may be used in the description of some embodiments to indicate that two or more components are in direct physical contact or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "applicable to" or "configured to" as used herein indicates an open and inclusive expression, which does not exclude devices that are applicable to or configured to perform additional tasks or steps.

As used herein, terms such as "about" or "approximately" indicates a stated value and an average value within an acceptable range of deviation of a particular value. The acceptable range of deviation is determined by a person of ordinary skill in the art in view of the measurement in question and the error associated with the measurement of a particular amount (i.e., the limitations of a measurement system).

Exemplary embodiments are described herein with reference to cross-sectional views and/or plan views as idealized exemplary drawings. In the accompanying drawings, thicknesses of layers and regions are enlarged for clarity. Therefore, variations in shape with respect to the drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a touch display device. The touch display device may be a display, a television, a billboard, a digital photo frame, a printer with a display function, a telephone, a mobile phone, a personal digital assistant (PDA), a digital camera, a portable camera recorder, a viewfinder, a navigator, a home appliance, or an information query device (for example, a business query device for e-government, banks, hospitals, power departments, post offices, and other departments).

The embodiments of the disclosure do not limited a type of the touch display device. For example, the touch display device may be a liquid crystal display (LCD) device or a self-luminous display device. In a case where the touch display device is a self-luminous display device, it may be an organic light-emitting diode (OLED) display device or a quantum-dot light-emitting diode (QLED) display device. OLED display devices have the advantages of light weight, small thickness, high luminous efficiency, foldable and curlable design, low power consumption and quick response. Therefore, the following description will be made by taking an example where the touch display device is an OLED display device.

As shown in FIG. 1A, a touch display device 1000 includes a touch display panel 1001, a housing 1002, a cover plate 1003, a circuit board 1002 and other electronic components. The housing 1002 has an opening, and a longitudinal section of the housing 1002 is U-shaped. The touch display panel 1001, the circuit board 1004 and other electronic components are all disposed inside the housing 1002. The cover plate 1003 covers the opening of the housing 1002. The circuit board 1004 is disposed on a side of the touch display panel 1001 facing away from the cover plate 1003.

The cover plate 1003 may be rigid or flexible. A rigid cover plate 1003 may be made of glass. A flexible cover plate 1003 may be made of polyimide (PI) or the like. In this case, the housing 1002 may be a foldable housing. As shown in FIG. 1A, a foldable housing 1002 includes a rotating shaft 1021, so that the touch display device 1000 may be folded along the rotating shaft 1021. In some embodiments of the present disclosure, the cover plate 1003 is not essential.

Figure 1B:
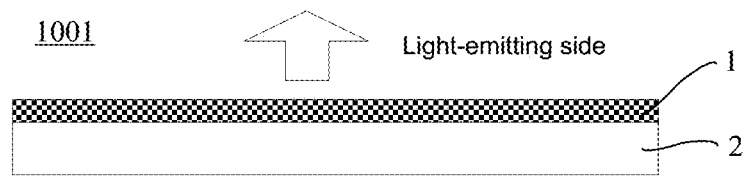
FIG. 1B is a structural diagram of a touch display panel in the touch display device shown in FIG. 1A.

As shown in FIG. 1B, the touch display panel 1001 includes a touch pad 1 (which may also be referred to as a touch screen, a touch structure or a touch layer) and a display panel 2. The touch pad 1 is disposed at a light-emitting side of the display panel 2.

The touch pad 1 may be implemented in various forms.

For example, the touch pad 1 is adhered to the display panel 2 through an adhesive layer. Any surface of the touch pad 1 perpendicular to a thickness direction of the touch pad 1 may be adhered to the display panel 2.

For example, as for some touch display devices 1000 having the cover plate 1003, the cover plate 1003 may be used as a base substrate of the touch pad 1. A plurality of film layers may be directly formed on the cover plate 1003 in sequence. The cover plate 1003 and the plurality of film layers together form the touch pad 1, and a surface of the cover plate 1003 having the plurality of film layers is adhered to the display panel 2.

For another example, a plurality of film layers may be directly formed on a display surface of the display panel 2. The plurality of film layers together form the touch pad 1.

Figure 1C:
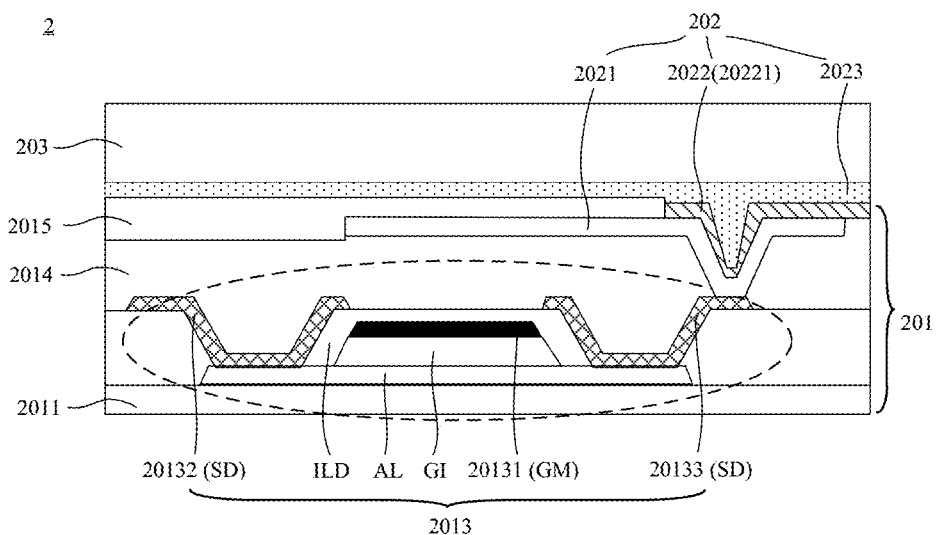
FIG. 1C is a structural diagram of a display panel in the touch display panel shown in FIG. 1B.
Figure 1D:
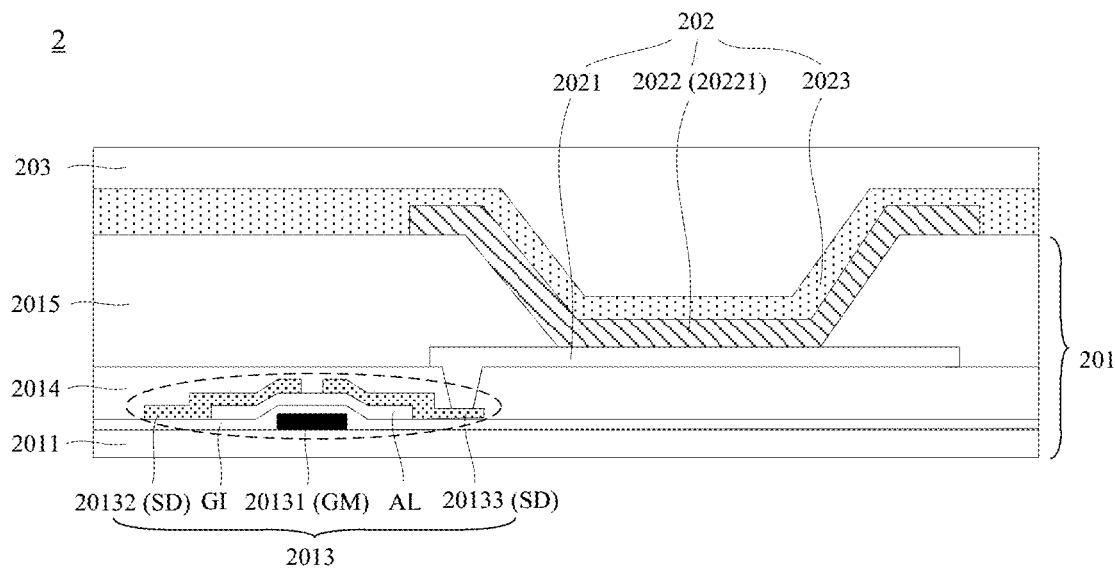
FIG. 1D is another structural diagram of a display panel in the touch display panel shown in FIG. 1B.

For example, the display panel 2 includes an encapsulation layer 203 (see FIG. 1C or 1D). A plurality of film layers are directly formed on the encapsulation layer 203 of the display panel 2 in sequence. The plurality of film layers together form the touch pad 1.

The display panel 2 is configured to display an image (i.e., a picture), and the touch pad 1 is configured to sense a touch position.

The touch display device 1000 may further include a processor, which may control the image displayed on the display panel 2 according to the touch position sensed by the touch pad 1, so as to realize human-computer interaction.

As shown in FIGS. 1C and 1D, taking an OLED display panel as an example, the display panel 2 includes an array substrate 201 having a plurality of pattern layers that are stacked, light-emitting devices 202 and an encapsulation layer 203. The encapsulation layer 203 is configured to prevent moisture and oxygen from entering the array substrate 201 and the light-emitting devices 202, so as to avoid display failures and other problems.

The array substrate 201 includes a base substrate 2011 and pixel circuits disposed on the base substrate 2011.

The base substrate 2011 may be a rigid base substrate or a flexible base substrate. A flexible base substrate 2011 may be made of one or more of polyimide (PI), polyethylene terephthalate (PET), polyethylene naphthalate two formic acid glycol ester (PEN), etc. A rigid base substrate 2011 may be made of, for example, glass.

The array substrate 201 further includes gate lines GL arranged in a direction, data lines DL insulated from and intersecting the gate lines, and common power lines usually parallel to the data lines, which are all arranged on the base substrate 2011. A plurality of sub-pixels may be defined by the gate lines GL and data lines DL that are arranged to cross each other. The pixel driving circuit is electrically connected to the gate line GL and data line DL, and includes at least one thin film transistor (TFT) 2013 and at least one capacitor (not shown in FIG. 1C or 1D). Each thin film transistor 2013 may adopt a top-gate or bottom-gate structure.

As shown in FIG. 1C, in a case where the thin film transistor 2013 has a top-gate structure. The thin film transistor 2013 includes an active layer AL, a gate insulation layer GI, and a gate metal pattern layer GM (used for forming the gate 20131), an interlayer dielectric layer ILD, and a source-drain metal pattern layer SD (used for forming the source 20132 and the drain 20133), which are all disposed on a side of the base substrate 2011. In some other embodiments, as shown in FIG. 1D, in a case where the thin film transistor 2013 has a bottom-gate structure, the thin film transistor 2013 includes a gate metal pattern layer GM (used for foriming the gate 20131), a gate insulation layer GI, an active layer AL and a source-drain metal pattern layer SD (used for forming the source 20132 and the drain 20133), which are all disposed on a side of the base substrate 2011.

The thin film transistor 2013 may be of various types. For example, the thin film transistor 2013 may be an N-type thin film transistor or a P-type thin film transistor, the difference between which only lies in the conduction conditions. The N-type thin film transistor is turned on under control of a high level, and is turned off under control of a low level. On the contrary, the P-type thin film transistor is turned on under control of a low level, and is turned off under control of a high level. The active layer AL of the thin film transistor 2013 may be composed of amorphous silicon, single crystal silicon, polycrystalline silicon, or an oxide semiconductor. The active layer AL includes a channel region that is not doped with impurities, and a source region and a drain region that are located on both sides of the channel region and formed by doping impurities. The doped impurities vary as the type of the thin film transistor 2013 changes, and may be N-type impurities or P-type impurities.

The capacitor includes a first electrode plate and a second electrode plate. An interlayer insulating film, as a dielectric, is provided between the two electrode plates.

Figure 1E:
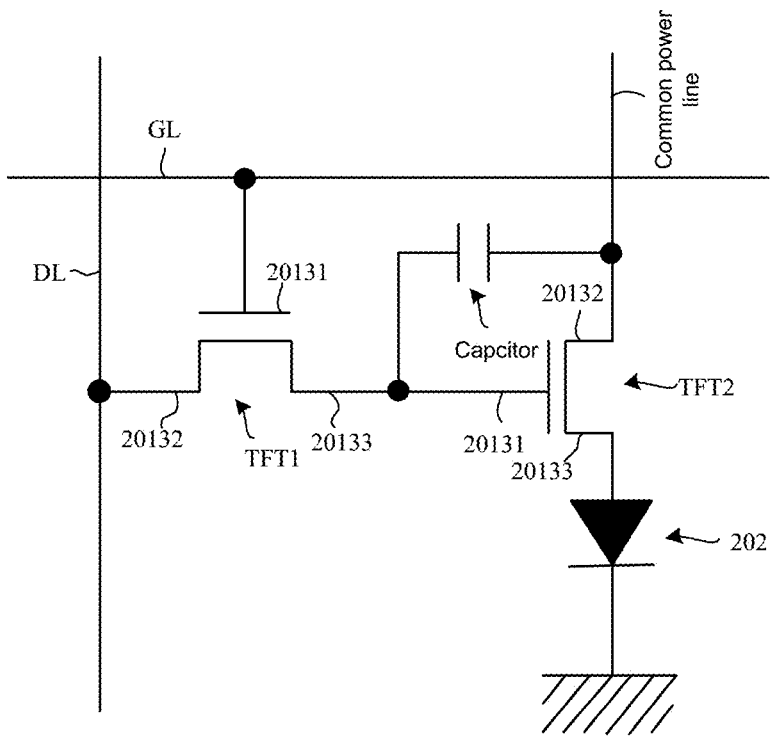
FIG. 1E is a structural diagram of a pixel circuit in the touch display panel shown in FIG. 1B.

In FIG. 1E, an electrical connection between the inside and outside of the pixel circuit is illustrated by taking a 2T1C structure, in which a pixel circuit 50 includes two thin film transistors 2013 (i.e., a switching thin film transistor TFT1 and a driving thin film transistor TFT2) and one capacitor, as an example. Although FIGS. 1C and 1D only show a structure and a connection relationship of the driving thin film transistor (the structure in the dashed circles in FIGS. 1C and 1D) and the light-emitting device 202, a person of ordinary skill in the art may completely determine a structure of a switching transistor and a connection relationship between the switching transistor and other components according to the context.

As shown in FIG. E, a gate 20131 of the switching thin film transistor TFT1 is connected to a gate line GL, a source 20132 of the switching thin film transistor TFT1 is connected to a data line 20131, and a drain 20133 of the switching thin film transistor TFT1 is connected to a gate 20131 of the driving thin film transistor TFT2. A source 20132 of the driving thin film transistor TFT2 is connected to a common power line, and a drain 20133 of the driving thin film transistor TFT2 is connected to a first electrode 2021 of the light-emitting device 202 through a via hole. A first electrode plate of the capacitor is connected to the gate 20131 of the driving thin film transistor TFT2, and the second electrode plate of the capacitor is connected to the source 20132 of the driving thin film transistor TFT2.

The switching thin film transistor TFT1 is turned on by a gate voltage applied to the gate line GL, and thereby transmit a data voltage applied to the data line DL to the driving thin film transistor TFT2. There is a certain difference between the data voltage transmitted from the switching thin film transistor TFT1 to the driving thin film transistor TFT2 and a common voltage applied from the common power line to the driving thin film transistor TFT2. A voltage equivalent to an absolute value of the difference is stored in the capacitor. A current corresponding to the voltage stored in the capacitor flows into the light-emitting device 202 through the driving thin film transistor TFT2, causing the light-emitting device 202 to emit light.

In addition, as shown in FIGS. 1C and 1D, the light-emitting device 202 includes a first electrode 2021, a light-emitting functional layer 2022 and a second electrode 2023, which are sequentially disposed on the array substrate 201. One of the first electrode 2021 and the second electrode 2023 is an anode (used for providing holes), and another of the first electrode 2021 and the second electrode 2023 is a cathode (used for providing electrons). The first electrode 2021 and the second electrode 2023 inject holes and electrons into the light-emitting functional layer 2022, respectively. When excitons generated from combination of the holes and electrons transition from an excited state to a ground state, light will be emitted.

The first electrode 2021 may be made of a metal with high reflectivity. The second electrode 2023 may be made of a transparent conductive film. In this case, light emitted by the light-emitting functional layer 2022 is reflected by the first electrode 2021, and then travels outward through the second electrode 2023, thereby forming a top-emission-type light-emitting device. But it is not limited thereto. In a case where the first electrode 2021 is made of a transparent conductive film, and the second electrode 2023 is made of a metal with high reflectivity, a bottom-emission-type light-emitting device may be formed. Of course, in a case where the first electrode 2021 and the second electrode 2023 are both made of a transparent conductive film, a double-sided-emission-type light-emitting device may be formed.

The transparent conductive film may be, for example, indium tin oxide (ITO), indium zinc oxide (IZO), indium gallium zinc oxide (IGZO), or other metal oxides. The metal with high reflectivity may be, for example, magnesium aluminum alloy (MgAl), lithium aluminum alloy (LiAl) and other alloys, or magnesium (Mg), aluminum (Al), lithium (Li), silver (Ag) and other pure metals.

In some embodiments, as shown in FIGS. 1O and 1D, the light-emitting functional layer 2022 may include a light-emitting layer 20221. In some other embodiments, in addition to the light-emitting layer 20221, the light-emitting functional layer 2022 further includes at least one of a hole injection layer (HIL), a hole transporting layer (HTL), an electron transporting layer (ETL) and an electron injection layer (EIL) (not shown in FIGS. 1C and 1D). In a case where the light-emitting layer 20221 includes all the above layers, the hole injection layer, the hole transporting layer, the light-emitting layer 20221, the electron transporting layer, and the electron injection layer are sequentially stacked on the first electrode 2021, which is used as an anode.

As shown in FIGS. 1C and 1D, the array substrate 201 further includes a planarization layer 2014 disposed between the thin film transistor 2013 and the first electrode 2021, and a pixel defining layer 2015 disposed on a side of the planarization layer 2014 away from the base substrate 2011. The pixel defining layer 2015 includes a plurality of opening regions, and barrier walls arranged around respective opening regions. One light-emitting device 202 is disposed in one opening region. The first electrodes 2021 of adjacent light-emitting devices 202 are separated by the barrier walls of the pixel defining layer 2015. The light-emitting layers 20221 of adjacent light-emitting devices 202 are separated by the barrier walls of the pixel defining layer 2015. The second electrode 2023s of the light-emitting devices 202 are connected together. That is, the second electrodes 2023 form a one-piece whole layer. The hole injection layers in the light-emitting functional layers 2022 of adjacent light-emitting devices 202 may be separated by the barrier walls of the pixel defining layer 2015, or may form a one-piece whole layer. The hole transporting layers in the light-emitting functional layers 2022 of adjacent light-emitting devices 202 may be separated by the barrier walls of the pixel defining layer 2015, or may form a one-piece whole layer. The electron transporting layers in the light-emitting functional layers 2022 of adjacent light-emitting devices 202 may be separated by the barrier walls of the pixel defining layer 2015, or may form a one-piece whole layer. The electron injection layers in the light-emitting functional layers 2022 of adjacent light-emitting devices 202 may be separated by the barrier walls of the pixel defining layer 2015, or may form a one-piece whole layer. The pixel defining layer 2015 may be made of, for example, black polyimide, which is capable of absorbing light emitted by one light-emitting device 202 and directed to an adjacent light-emitting device 202 and thus avoiding light mixing between two adjacent sub-pixels.

The encapsulation layer 203 may be an encapsulation film. The number of layers of the encapsulation film is not limited. In some embodiments, the encapsulation layer 203 may include one layer of encapsulation film, or may include two or more layers of encapsulation films that are stacked. For example, the encapsulation layer 203 includes three layers of encapsulation films that are stacked in sequence.

In a case where the encapsulation layer 203 includes three layers of encapsulation films that are stacked in sequence, an encapsulation film located in the middle layer is made of an organic material, and encapsulation films located on both sides are made of an inorganic material. The organic material may be, for example, polymethyl methacrylate (PMMA). The inorganic material may be one or more of silicon nitride ($SiN_x$), silicon oxide ($SiO_x$) or silicon oxynitride ($SiO_xN_y$).

Figure 2:
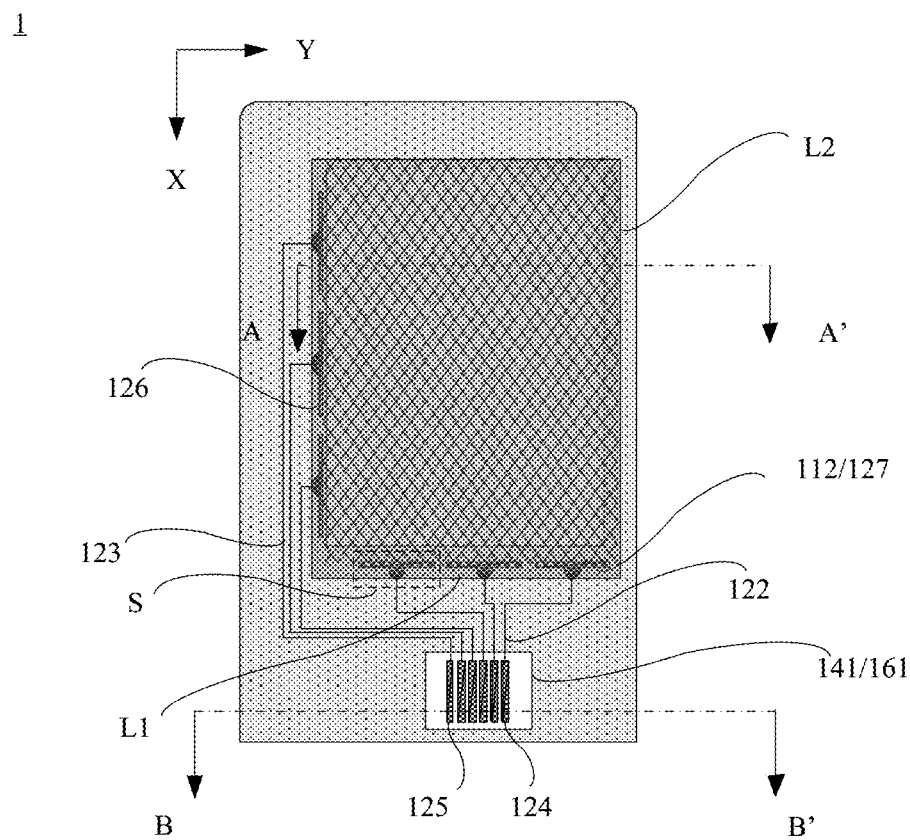
FIG. 2 is a structural diagram of a touch pad, in accordance with some embodiments.
Figure 3:
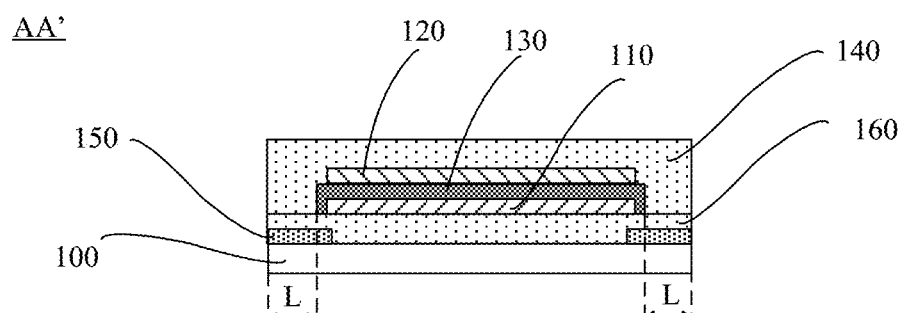
FIG. 3 is a cross-sectional view of the touch pad shown in FIG. 2 taken along a line A-A'.
Figure 4:
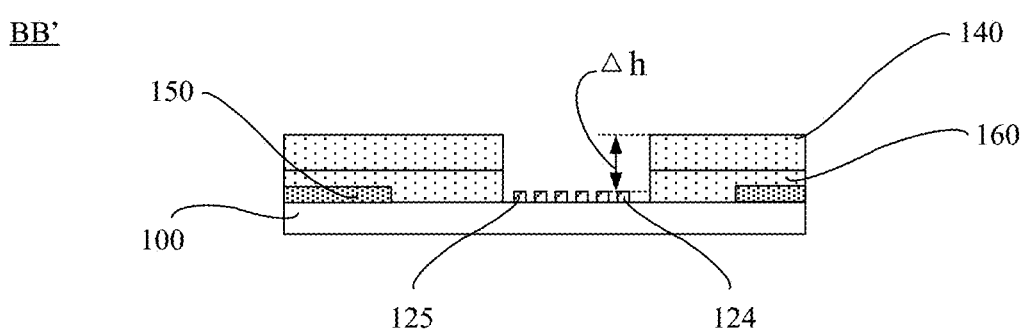
FIG. 4 is a cross-sectional view of the touch pad shown in FIG. 2 taken along a line B-B'.

Referring to FIGS. 2~4, the touch pad 1 is an OGM type touch pad. The touch pad 1 includes a base 100, a first conductive pattern layer 110 disposed on the base 100, a second conductive pattern layer 120 disposed on the base 100, and a first insulating layer 130 located between the first conductive pattern layer 110 and the second conductive pattern layer 120.

Hereinafter, each part of the touch pad 1 will be described in detail.

The base 100 is configured to carry a plurality of film layers of the touch pad 1, and may be a blank base substrate or a carrying layer. In a case where the base 100 is a blank base substrate, the blank base substrate may be a rigid substrate, for example, a glass base substrate or a polymethyl methacrylate (PMMA) base substrate. For another example, the blank base substrate may be a flexible base substrate, for example, a polyethylene terephthalate (PET) base substrate, a polyethylene naphthalate two formic acid glycol ester (PEN) base substrate, or a polyimide (PI) base substrate. For example, for some touch display devices 1000 having the cover plate 1003, the cover plate 1003 may be used as the base 100 of the touch pad 1. For another example, for touch display devices including an OLED display panel, the encapsulation layer 203 may be reused as the base 100 of the touch pad 1.

In some embodiments, the base 100 may be reused as a protective substrate of the touch display device 1000. A plurality of film layers may be formed on a side of the protective substrate proximate to the display panel 2, so as to obtain the touch pad 1.

A thin film is formed on the base 100 by any of a deposition process, a coating process, a sputtering process, and other film forming processes. Then the thin film is patterned by a patterning process to form a film layer including at least one pattern, which is called a patterned layer (for example, the first conductive pattern layer 110, the second conductive pattern layer 120, etc.). In some embodiments of the present disclosure, a plurality of patterns belonging to a same pattern layer is referred to as being disposed in a same layer.

The patterning process refers to a process for forming a film layer structure with a certain pattern. For example, the patterning process includes a photolithographic process and a printing (e.g., ink jet printing) process. The photolithographic process includes the following steps: coating a film layer to be patterned with a photoresist (or directly patterning a photoresist film layer); exposing the photoresist; developing the exposed photoresist; etching portions of the film layer to be patterned that are exposed after the photoresist is developed (for example, by a wet etching process or a dry etching process); and removing the photoresist. It will be noted that, the film layer structure having a certain pattern formed through the patterning process may be continuous or discontinuous, and various portions of the film layer structure may be at different heights and have different thicknesses.

Figure 5A:
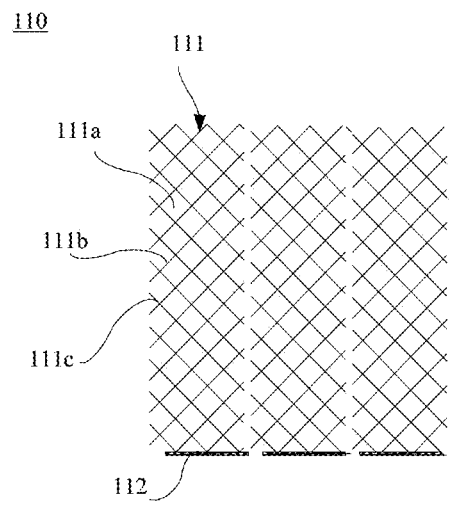
FIGS. 5A~5C are structural diagrams of a first metal pattern layer and a second metal pattern layer, in accordance with some embodiments.

Referring to FIGS. 2 and 5A, the first conductive pattern layer 110 includes at least one first touch electrode 111 extending in a first direction X.

Embodiments of the present disclosure do not limit the number of the first touch electrodes 111. For example, the number of the first touch electrodes 111 may be one, two, three or more. For example, FIG. 5A illustrates an example where there are three first touch electrodes 111, with a gap between two adjacent first touch electrodes 111.

Embodiments of the present disclosure do not limit a shape enclosed by a contour line of the first touch electrode 111. For example, it may be a long strip such as a rectangle and a parallelogram. For example, as shown in FIG. 5A, the shape enclosed by the contour line of the first touch electrode 111 is a rectangle. The rectangle includes two long sides extending in the first direction X and arranged opposite to each other, and two short sides extending in a second direction Y, connecting the two long sides and arranged opposite to each other. The second direction Y intersects the first direction X. In some embodiments, the second direction Y is perpendicular to the first direction X.

The first touch electrode 111 is a mesh electrode, and has a plurality of openings 111a arranged at intervals. Shapes of the plurality of openings 111a are not limited, and may be any of a polygon, a circle, an ellipse, etc. The polygon may be, for example, a hexagon, a quadrilateral, or a triangle. The quadrilateral may be, for example, a rectangle, a square or a parallelogram. For example, in some embodiments, the first touch electrode 111 includes a plurality of first touch electrode lines 111b arranged in parallel, a plurality of second touch electrode lines 111c arranged in parallel, and a plurality of quadrilateral openings 111 formed by the plurality of first touch electrode lines 111b and the plurality of second touch electrode lines 111c intersecting each other. It will be understood that, at edge regions of the first touch electrode 111, at least some of the openings 111a are not closed patterns.

A material of the first conductive layer 110 is not limited, and may be selected from at least one of metals, metal alloys, metal oxide conductive materials, organic conductive materials, carbon nanotubes, or graphene.

Figure 7A:
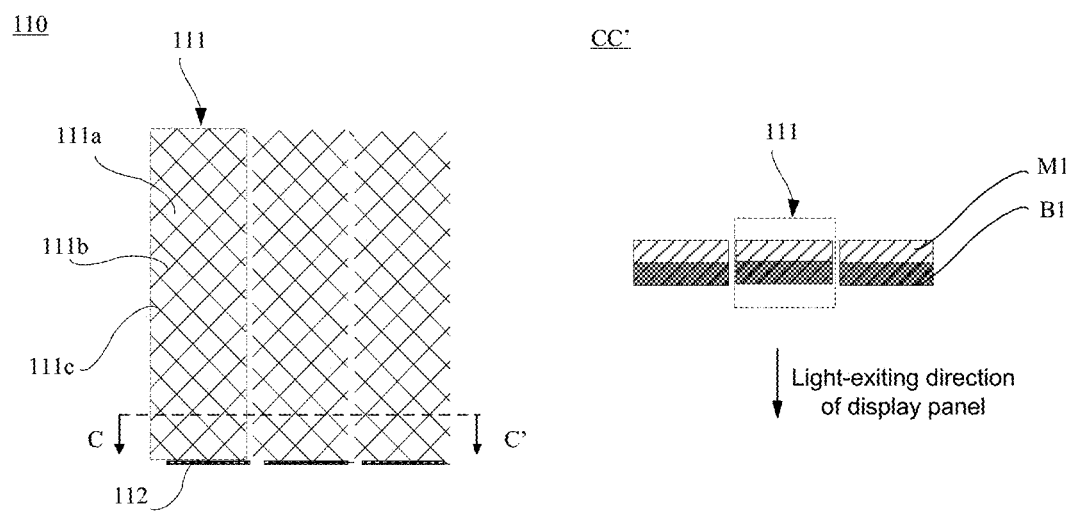
FIGS. 7A~7B are structural diagrams of a first metal layer and a first blackened layer, in accordance with some embodiments.
Figure 7B:
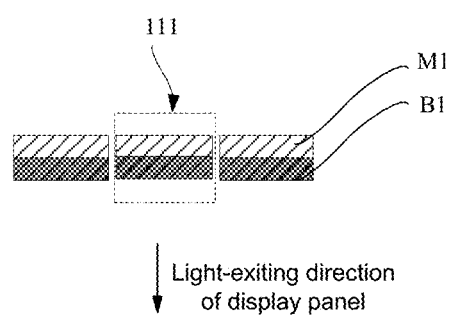

The first conductive pattern layer 110 may include one pattern layer, or at least two pattern layers that are stacked, orthographic projections of which on the base 100 coinciding with each other. For example, as shown in FIGS. 7A and 7B, the first conductive pattern layer 110 includes two pattern layers that are stacked, i.e., a first metal layer M1 and a first blackened layer B1.

The first blackened layer B1 is located on a side of the first metal layer M1 proximate to a touch surface of the touch pad 1. The touch surface herein refers to a surface of the touch pad 1 proximate to a touch body (for example, a finger, a stylus pen, etc.). In a case where the touch pad 1 is applied to the touch display device 1000, a side proximate to the touch surface of the touch pad 1 is a side proximate to a display surface of the touch display device 1000. In this way, the first blackened layer B1 may reduce the influence of the metallic luster of the first metal layer M1 on the look and feel of the display device. For example, in a case where the touch surface is a lower surface of the touch pad 1 shown in FIG. 3, the first blackened layer B1 is located on a side of the first metal layer M1 proximate to the base 100. In a case where the touch surface is an upper surface of the touch pad 1 shown in FIG. 3, the first blackened layer B1 is located on a side of the first metal layer M1 away from the base 100.

Since orthographic projections of the first metal layer M1 and the first blackened layer B1 on the base 100 coincide with each other, during manufacturing, a metal film and a blackened film that are stacked may be fabricated on the base 100 first, and then the two films are patterned to form the first metal layer M1 and the first blackened layer B1 having the same shape. For example, the first metal layer M1 may be made of any one of aluminum, magnesium, or other metal or alloy materials. The first blacken layer B1 may be made of any one of a metal oxide, $SiN_xO_y$, molybdenum oxide ($MoO_2$), silicon nitride ($Si_3N_4$), or other materials. The metal oxide may be, for example, an oxide of the metal used in the first metal layer M1, for example, $Al_2O_3$.

For example, in the case where the touch surface is the lower surface of the touch pad 1 shown in FIG. 3, a first blackened film may be formed on the base 100 first, then a first metal film may be formed on a side of the first blackened film away from the base 100, and then the first metal film and the first blackened film are patterned to form the first conductive pattern layer 110. In the case where the touch surface is the upper surface of the touch pad 1 shown in FIG. 3, a first metal film may be formed on the base 100 first, then a first blackened film may be formed on a side of the first metal film away from the base 100, and then the blackened film and the first metal film are patterned to form the first conductive pattern layer 110.

Figure 5B:
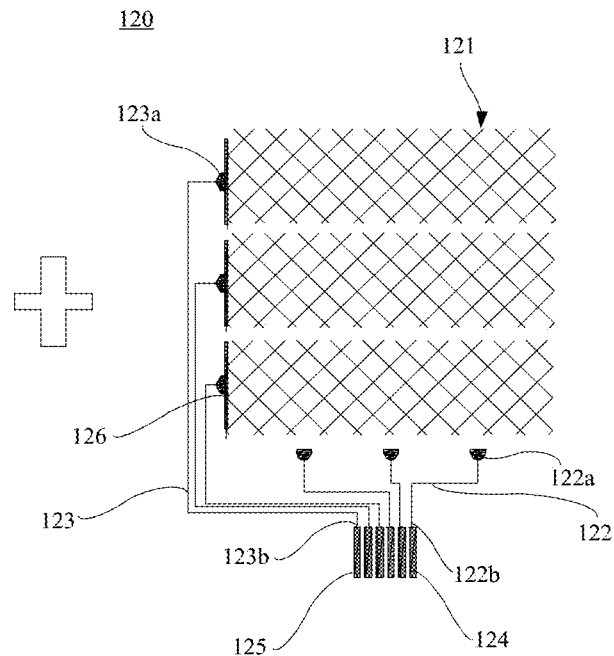

Referring to FIGS. 2 and 5B, the second conductive pattern layer 120 includes at least one second touch electrode 121 extending in the second direction Y. The second direction Y and the first direction X intersect. In some embodiments, the second direction Y is perpendicular to the first direction X.

Embodiments of the present disclosure do not limit the number of the second touch electrodes 121. For example, the number of the second touch electrodes 121 may be one, two, three or more. For example, FIG. 5B illustrates an example where there are three second touch electrodes 121, with a gap between two adjacent second touch electrodes 121.

As to a shape of the second touch electrode 121, reference may be made to the description of the first touch electrode 111 above, and details will not be repeated here. It will be understood that the shapes of the first touch electrode 111 and the second touch electrode 121 may be the same or different.

The materials of the first electrode 111 and the second electrode 121 may be the same or different. As to a material of the second conductive layer 120, reference may be made to the description of the first conductive layer 110 above, and details will not be repeated here.

Figures 8A, 8B:
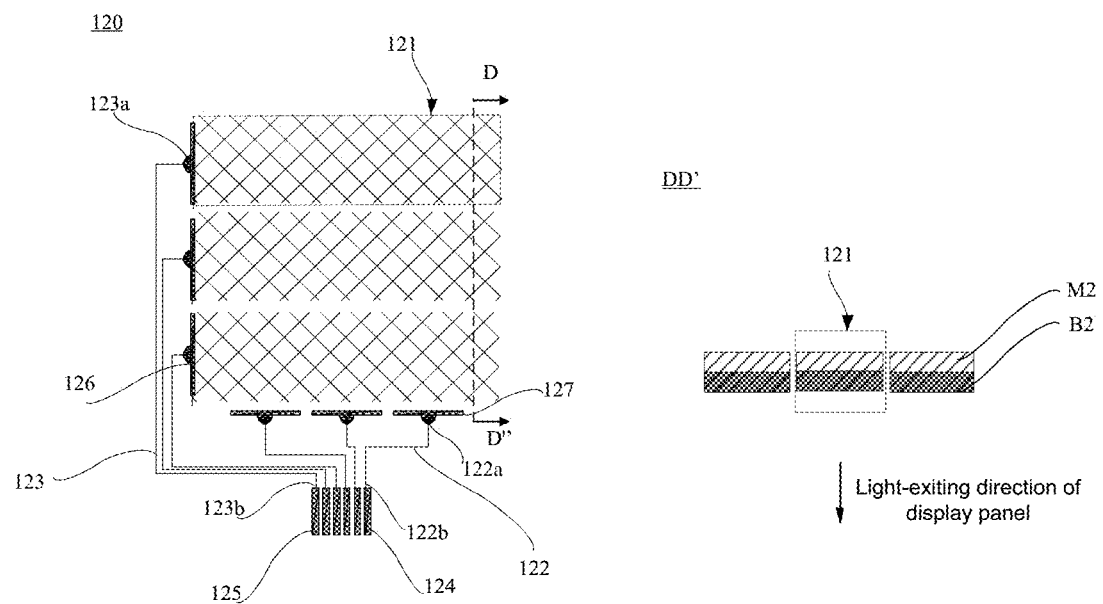
FIGS. 8A~8B are structural diagrams of a second metal layer and a second blackened layer, in accordance with some embodiments.
Figure 9:
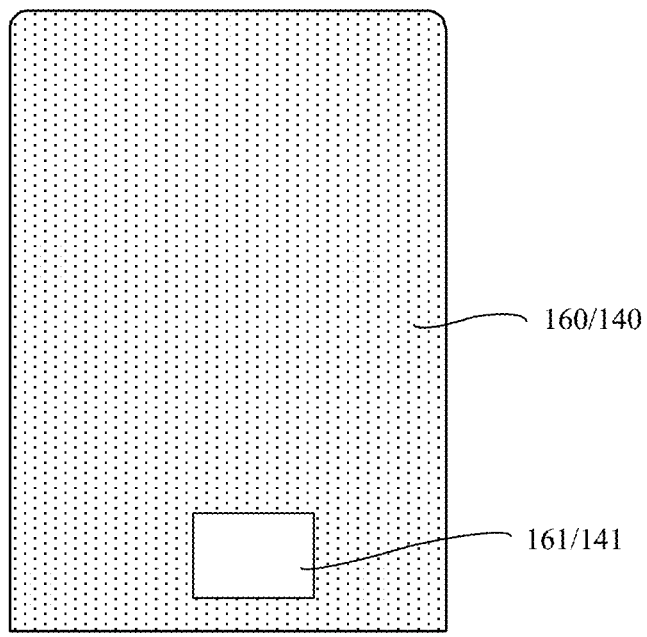
FIG. 9 is a structural diagram of a third insulating layer and a third opening, in accordance with some embodiments.
Figure 10:
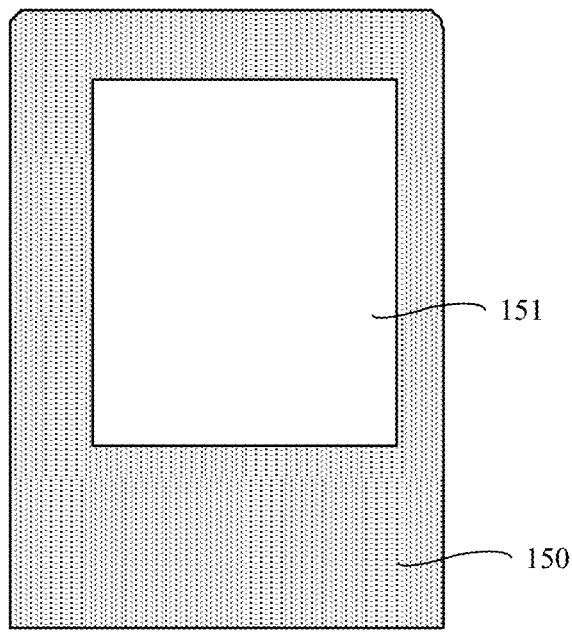
FIG. 10 is a structural diagram of a light-shielding layer and a second opening, in accordance with some embodiments.

Similarly, the second conductive pattern layer 120 may include one pattern layer, or at least two pattern layers that are stacked, orthographic projections of which on the base 100 coinciding with each other. For example, as shown in FIGS. 8A and 8B, the second conductive pattern layer 120 includes two pattern layers that are stacked, i.e., a second metal layer M2 and a second blackened layer B2.

The second blackened layer B2 is located on a side of the second metal layer M2 proximate to the touch surface of the touch pad 1. For example, in the case where the touch surface is the lower surface of the touch pad 1 shown in FIG. 3, the second blackened layer B2 is located on a side of the second metal layer M2 proximate to the base 100. In the case where the touch surface is the upper surface of the touch pad 1 shown in FIG. 3, the second blackened layer B2 is located on a side of the second metal layer M2 away from the base 100.

In addition, as to a material and a fabrication process of the second conductive pattern layer 120, reference may be made to description of the two pattern layers in the first conductive pattern layer 110 above. For example, the second metal layer M2 is made of the same material and fabricated by the same process as the first metal layer M1, and the second blackened layer B2 is made of the same material and fabricated by the same process as the first blackened layer B1.

With continued reference to FIGS. 2 and 5B, the second conductive pattern layer 120 further includes at least one first trace 122 that is in one-to-one correspondence with the at least one first touch electrode 111, at least one second trace 123 that is in one-to-one correspondence with the at least one second touch electrode 121, at least one first bonding pad 124 that is in one-to-one correspondence with the at least one first touch electrode 111, and at least one second bonding pad 125 that is in one-to-one correspondence with the at least one second touch electrode 121.

Figure 5C:
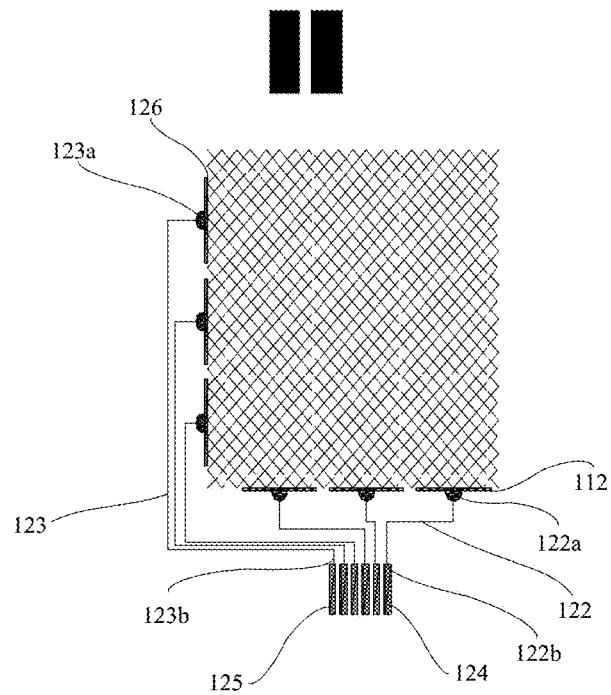

For example, as shown in FIGS. 5A~5C, the first conductive pattern layer 110 includes three first touch electrodes 111, and the second conductive pattern layer 120 includes three first traces and three first bonding pads 124 that are in one-to-one correspondence with the three first touch electrodes 111. The second conductive pattern layer 120 includes three second touch electrodes 121, and three second traces 123 and three second bonding pads 125 that are in one-to-one correspondence with the three second touch electrodes 121.

Referring to FIGS. 2 and 5C, a first end 122a of each first trace 122 is coupled to a corresponding first touch electrode 111, and a second end 122b of each first trace 122 is coupled to a corresponding first bonding pad 124, so that each first touch electrode 111 is connected to a corresponding first bonding pad 124 through a corresponding first trace 122. A first end 123a of each second trace 123 is coupled to a corresponding second touch electrode 121, and a second end 123b of each second trace 123 is coupled to a corresponding second bonding pad 125, so that each second touch electrode 121 is connected to a corresponding second bonding pad 125 through a corresponding second trace 123. Herein, there is a gap between any two adjacent traces among the plurality of first traces 122 and the plurality of second traces 123, and there is a gap between any two adjacent bonding pads among the plurality of first bonding pads 124 and the plurality of second bonding pads 125. The plurality of traces and the plurality of bonding pads do not interfere or overlap with each other.

It will be understood that, since both the first conductive pattern layer 110 and the second conductive pattern layer 120 may include two pattern layers, each pattern in the conductive pattern layer 110 or 120 may be composed of two layers of materials. For example, the plurality of patterns (for example, the second touch electrode 121, the first trace 122, the second trace 123, the first bonding pad 124, and the second bonding pad 125, etc.) included in the second conductive pattern layer 120 may all include two layers of materials, for example, one layer of metal material and one layer of blackened material.

The first direction X and the second direction Y are two directions in a plane where the touch pad 1 is located. An angle between the first direction X and the second direction Y is greater than 0° and less than 180°. In some accompanying drawings, the angle between the first direction and the second direction is 90°, which is merely an example. The angle may be set to other values. For example, the angle between the first direction and the second direction is set to 30°, 45°, or 60°, etc.

The first insulating layer 130 is located between the first conductive pattern layer 110 and the second conductive pattern layer 120, and is configured to electrically insulate the first touch electrode 111 and the second touch electrode 121 from each other. The first insulating layer 130 may be a light-transmitting film layer, and may be made of, for example, silicon nitride or silicon oxide.

In some embodiments of the present disclosure, the first bonding pad 124 and the second bonding pad 125 are arranged in a same layer, and are both a part of the second conductive pattern layer 120. The first conductive pattern layer 110 does not include bonding pads. The plurality of first touch electrodes 111 are coupled to the plurality of first bonding pads 124 in the second conductive pattern layer 120 in one-to-one correspondence through the plurality of first traces 122. In the second conductive pattern layer 120, the plurality of second touch electrodes 121 are coupled to the plurality of second bonding pads 125 in one-to-one correspondence through the plurality of second traces 123. As a result, it may be possible to realize touch control through a single layer of bonding pads.

In a comparative embodiment, an OGM type touch panel is configured to include two layers of first bonding pads and second bonding pads that are stacked, that is, one layer of first bonding pads and second bonding pads located in the first conductive pattern layer, and another layer of first bonding pads and second bonding pads located in the second conductive pattern layer. The first bonding pads and second bonding pads located in the first conductive pattern layer all include a first metal layer and a first blackened layer that are stacked. The first bonding pads and second bonding pads located in the second conductive pattern layer all include a second metal layer and a second blackened layer. Thus, the two layers of first bonding pads and the two layers of second bonding pads form a sandwich structure: a blackened layer is sandwiched between two metal layers.

The expansion coefficients of the blackened layer and the metal layer are different. The blackened layer may be easily affected by a high temperature process in subsequent processes, which reduces a bonding force between the blackened layer and the metal layer and generates a breaking stress. As a result, the adhesion between the two layers of first bonding pads or between the two layers of second bonding pads decreases, which increases a probability of the two layers of bonding pads detaching from each other and thus affects a pass rate of the product.

In some embodiments of the present disclosure, only a sigle layer of first bonding pads and second bonding pads are provided in the second conductive pattern layer. In this case, it may be possible to avoid the problem in the comparative embodiment to a great extent. That is, the problem that one layer of bonding pads detach from the other layer of bonding pads due to decreased adhesion between the two layers of first bonding pads or between the two layers of second bonding pads in a high temperature process may be avoided, and thus the pass rate of the product may be improved.

Figure 21:
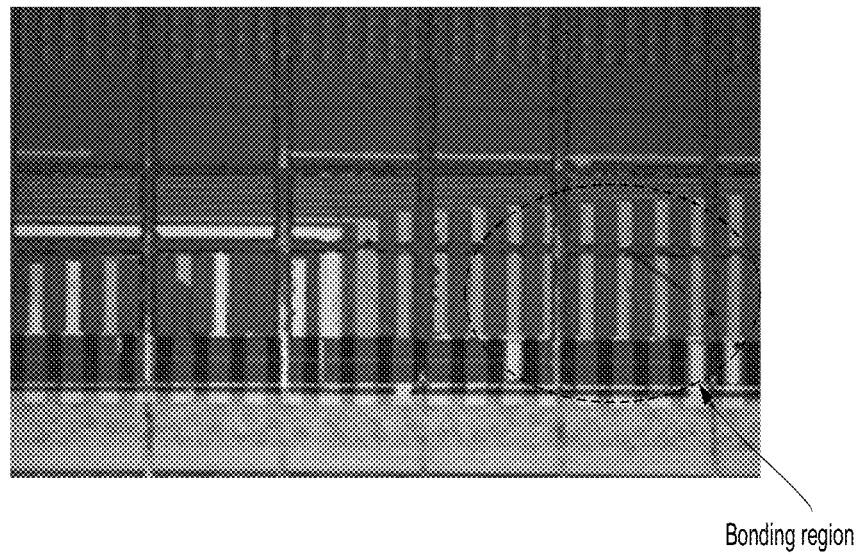
FIG. 21 is a diagram showing a result of of a cross cut test of a bonding region of a touch pad in a comparative embodiment.
Figure 22:
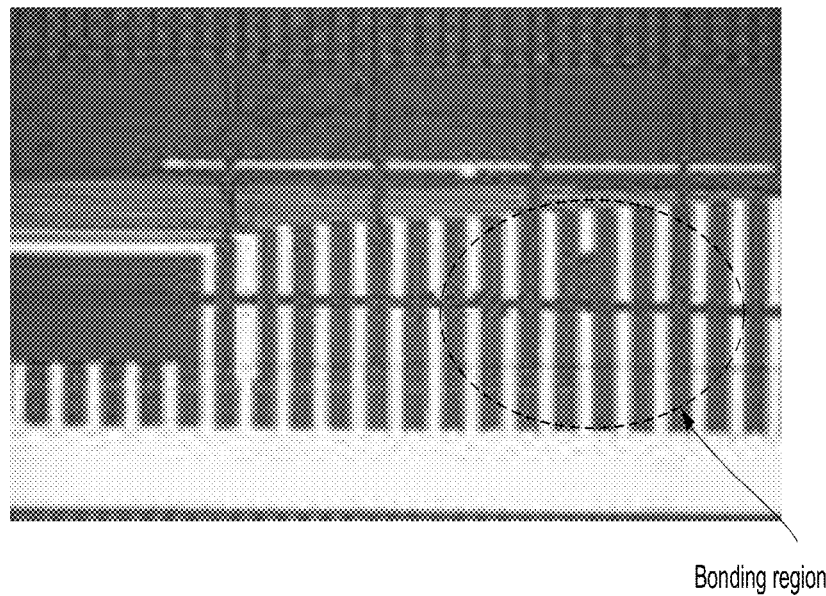
FIG. 22 is a diagram showing a result of a cross cut test of a bonding area of a touch pad in some embodiments of the present disclosure.

Based on the touch pad in the above examples, a cross cut test is carried out on a bonding region in the comparative embodiment and the bonding region in the embodiments of the present disclosure, so as to compare the adhesion of the bonding pads in the two solutions. According to the ASTM standard (ASTM stands for the American Society of Testing Materials), adhesion is rated on a scale ranging from 0B to 5B. The higher the value, the greater the adhesion of the film and the more difficult for the film to be peeled off. FIG. 21 is a diagram showing the cross cut test results of the solution of providing two layers of bonding pads in the bonding region of the touch pad in the comparative embodiment. It can be seen that the situation of the two layers of bonding pads detaching from each other is very serious, and the adhesion is mostly rated at 0 to 2B by the ASTM standard. FIG. 22 is a diagram showing the cross cut test results of the solution of providing only a single layer of bonding pads in the bonding region of the touch pad in some embodiments of the present disclosure. It can be seen that, compared to the comparative embodiment, the situation of the two layers of bonding pads detaching from each other is greatly improved, and the adhesion is all rated at or above 4B (≥4B). As can be seen from the result of the comparative experiments, the solution provided in some embodiments of the present disclosure may significantly improve the adhesion of the bonding pads, and thus help improve the pass rate of the product.

It will be noted that, the embodiments of the present disclosure are not limited to only providing a single layer of first bonding pads 124 and second bonding pads 125 in the second conductive pattern layer 120. In some embodiments, it may also be arranged that only a single layer of first bonding pads 124 and second bonding pads 125 are provided in the first conductive pattern layer 110. However, compared with the solution of only providing a single layer of first bonding pads 124 and second bonding pads 125 in the second conductive pattern layer 120, the manufacturing process for the solution of only providing a single layer of first bonding pads 124 and second bonding pads 125 in the first conductive pattern layer 110 may be more complicated.

In some embodiments of the present disclosure, the first conductive pattern layer 110 is more proximate to the base 100 than the second conductive pattern layer 120. In a case where the first conductive pattern layer 110 and the second conductive pattern layer 120 are made of the same material and are both formed by an etching process (such as a wet etching process), assuming that the first bonding pads 124 and the second bonding pads 125 are formed in the first conductive pattern layer 110, since the first bonding pads 124 and the second bonding pads 125 need to be bonded with a flexible printed circuit board (FPC) or other kinds of circuit boards, all of them need to be exposed outside of the first insulating layer 130. This requires that, before the second conductive pattern layer 120 without the first bonding pads 124 and the second bonding pads 125 is fabricated, the first insulating layer 130 covering the first bonding pads 124 and the second bonding pads 125 needs to be retained; and after the second conductive pattern layer 120 has been fabricated, the first insulating layer 130 covering the first bonding pads 124 and the second bonding pads 125 needs to be removed.

For example, when the first insulating layer 130 is formed, the insulating material covering the first bonding pads 124 and the second bonding pads 125 in the first conductive pattern layer 110 is not removed, so that the first insulating layer 130 may protect the first bonding pads 124 and the second bonding pads 125 in the first conductive pattern layer 110. As a result, it may be possible to prevent the first bonding pads 124 and the second bonding pads 125 in the first conductive pattern layer 110 from being etched away in a subsequent process of forming the second conductive pattern layer 120 without the first bonding pads 124 and the second bonding pads 125, and thus avoid a resultant failure of the formed touch pad 1. After the second conductive pattern layer 120 without the first bonding pads 124 and the second bonding pads 125 is formed, the insulating material of the first insulating layer 130 covering the first bonding pads 124 and the second bonding pads 125 in the first conductive pattern layer 110 is removed, so that the first bonding pads 124 and the second bonding pads 125 in the first conductive pattern layer 110 are exposed to be bonded with a circuit board such as an FPC.

However, if the first bonding pads 124 and the second bonding pads 125 are provided in the second conductive pattern layer 120, not only the first touch electrodes 111 in the first conductive pattern layer 110 are protected by the first insulating layer 130, but also the second conductive pattern layer 120 will not be affected by a manufacturing process of the first conductive pattern layer 110, because the second conductive pattern layer 120 is fabricated later.

In some other embodiments of the present disclosure, the first conductive pattern layer 110 is more proximate to the base 100 than the second conductive pattern layer 120. It is assumed that, the first bonding pads 124 and the second bonding pads 125 are provided in the first conductive pattern layer 110, and the first bonding pads 124 and the second bonding pads 125 are located outside a range covered by the first insulating layer 130. In order to prevent the first bonding pads 124 and the second bonding pads 125 that are not covered by the first insulating layer 130 from being etched away when the second conductive pattern layer 120 is formed, it may be arranged that the first conductive pattern layer 110 and the second conductive pattern layer 120 are made of different materials. For example, the first conductive pattern layer 110 is made of a metal, and the second conductive pattern layer 120 is made of graphene, so that the first bonding pads 124 and the second bonding pads 125 in the first conductive pattern layer 110 will not be etched away in a patterning process for forming the second conductive pattern layer 120.

In some embodiments, it may also be arranged that only a single layer of first bonding pads 124 is provided in the first conductive pattern layer 110, and only a single layer of second bonding pads 125 is provided in the second conductive pattern layer 120. In this case, a method for fabricating the first conductive pattern layer 110 with the first bonding pads 124 and the second conductive pattern layer 120 with the second bonding pads 125 is similar to the method for fabricating the first conductive pattern layer 110 with the first bonding pads 124 and the second bonding pads 125 and the second conductive pattern layer 120 without the first bonding pads 124 and the second bonding pads 125.

For example, before fabricating the second conductive pattern layer 120 with the second bonding pads 125, the first insulating layer 130 covering the first bonding pads 124 in the first conductive pattern layer 110 needs to be retained, so as to prevent the first bonding pads 124 in the first conductive pattern layer 110 from being etched away when the second conductive pattern layer 120 with the second bonding pads 125 is formed in a subsequent process. And after the second conductive pattern layer 120 has been fabricated, the first insulating layer 130 covering the first bonding pads 124 needs to be removed, so as to expose the first bonding pads 124 in the first conductive pattern layer 110, so that they may be bonded with a circuit board such as an FPC.

For example, in order to prevent the first bonding pads 124 that are not covered by the first insulating layer 130 from being etched away when the second conductive pattern layer 120 is formed, it may be arranged that the first conductive pattern layer 110 and the second conductive pattern layer 120 are made of different materials. For example, the first conductive pattern layer 110 is made of a metal, and the second conductive pattern layer 120 is made of graphene.

In some embodiments of the present disclosure, as shown in FIG. 5A, the first conductive pattern layer 110 further includes at least one first connection pad 112 that is in one-to-one correspondence with the at least one first touch electrode 111. For example, the first conductive pattern layer 110 includes three first connection pads 112 that are in one-to-one correspondence with three first touch electrodes 111.

Each first connection pad 112 (or C-Pad) is located at an end of a corresponding first touch electrode 111. The first end 122a of each first trace 122 is coupled to a corresponding touch electrode 111 through a corresponding first connection pad 112. The first connection pad 112 may couple the ends of the plurality of touch electrode lines in the first touch electrode 111 together. In addition, a width of the first connection pad 112 may be greater than a width of each touch electrode line, so that the connection between the first trace 122 and the first touch electrode 111 is even more reliable.

As shown in FIG. 5B, the second conductive pattern layer 120 further includes at least one second connection pad 126 that is in one-to-one correspondence with the at least one second touch electrode 121. For example, the second conductive pattern layer 120 includes three second connection pads 126 that are in one-to-one correspondence with three second touch electrodes 121. Each second connection pad 126 is located at an end of a corresponding second touch electrode 121. The first end 123a of each second trace 123 is coupled to a corresponding second touch electrode 121 through a corresponding second connection pad 126. The second connection pad 126 also has similar effect to that of the first connection pad 112 described above.

Figure 14:
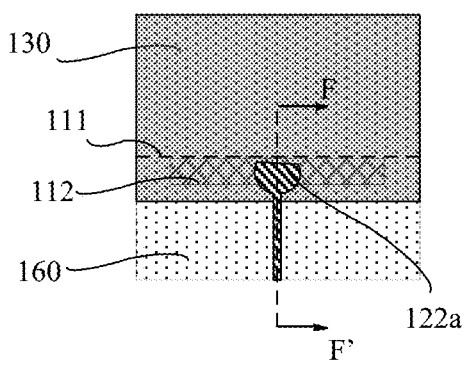
FIG. 14 is a structural diagram of a region S (as marked in FIG. 2), in accordance with some embodiments.
Figure 18:
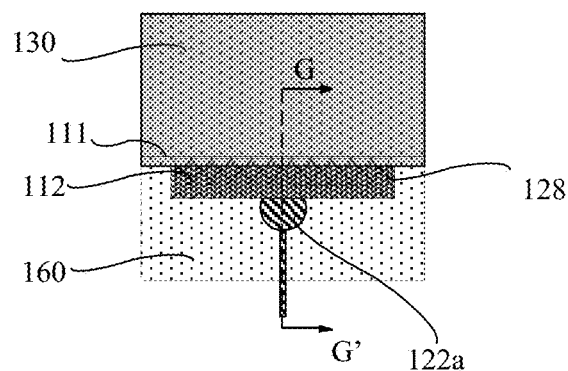
FIG. 18 is still another structural diagram of a region S (as marked in FIG. 2), in accordance with some embodiments.

In some embodiments of the present disclosure, as shown in FIGS. 14, 16 and 18, an orthographic projection of a whole formed by the at least one first touch electrode 111 on the base 100 is located within an orthographic projection of the first insulating layer 130 on the base 100. An orthographic projection of the first connection pad 112 on the base 100 at least partially overlaps with the orthographic projection of the first insulating layer 130 on the base 100. That is, in some embodiments, a part of a surface of the first connection pad 112 is exposed outside of the first insulating layer 130. The first end 122 of the first trace 122 is coupled to the exposed surface of a corresponding first connection pad 112. For example, as shown in FIGS. 15, 17A~17B and 19A~19B, the first connection pad 112 includes a top surface 112a proximate to the first insulating layer 130, and a side surface 112b connected to the top surface 112a and facing away from the first touch electrode 111. At least a portion of the top surface 112a and/or at least a portion of the side surface 112b are exposed. For example, as shown in FIGS. 14~15, an orthographic projection of the first touch electrode 111 on the base 100 and an orthographic projection of the first connection pad 112 on the base 100 are both located within the orthographic projection of the first insulating layer 130 on the base 100. That is, the first insulating layer 130 completely covers the plurality of first touch electrodes 111 and the plurality of first connection pads 112. At least one via hole 131 that is in one-to-one correspondence with the at least one first connection pad 112 is provided in the first insulating layer 130. Each via hole 131 exposes a portion of the top surface 112a of a corresponding first connection pad 112. The first end 122a of each first trace 122 is coupled to the surface of a corresponding first connection pad 112 exposed from a corresponding via hole through the corresponding via hole 131, so that each first trace 122 is coupled to a corresponding first touch electrode 111.

For example, as shown in FIGS. 16 and 18, the orthographic projection of the first touch electrode 111 on the base 100 is located within the orthographic projection of the first insulating layer 130 on the base 100. A portion of the orthographic projection of the first connection pad 112 on the base 100 is located outside of the orthographic projection of the first insulating layer 130 on the base 100. That is, a portion of the top surface 112a and the side surface 112b of the first connection pad 112 are exposed outside of the first insulating layer 130.

On this basis, for example, as shown in FIG. 17A, the first end 122a of each first trace 122 is coupled to the top surface 112a and the side surface 112b of a corresponding first connection pad 112, so that each first trace 122 is coupled to a corresponding first touch electrode 111. Although the first end 122a of the first trace 122 shown in FIG. 17A does not cover the first insulating layer 130, it will be understood that, the first end 122a of each first trace 122 may also cover the first insulating layer 130 while being coupled to the top surface 112a and the side surface 112b of a corresponding first connection pad 112. In this way, it may also be possible to realize that each first trace 122 is coupled to a corresponding first touch electrode 111.

For example, as shown in FIG. 17B, the first end 122a of each first trace 122 is directly connected to a side surface 112b of a corresponding first connection pad 112, so that each first trace 122 is coupled to a corresponding first touch electrode 111.

Figure 19A:
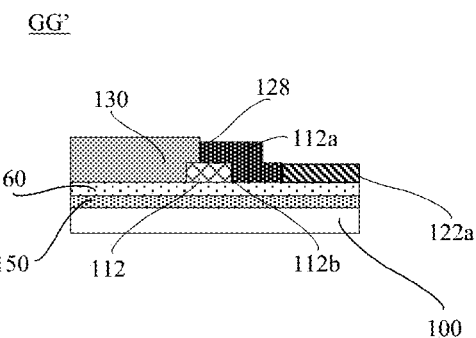
FIGS. 19A~19B are cross-sectional views of the region S shown in FIG. 18 along a G-G' direction.

For example, as shown in FIG. 19A, the second conductive pattern layer 120 further includes at least one third connection pad 128. Each third connection pad 128 is coupled to a first end 122a of a corresponding first trace 122. In the meantime, each third connection pad 128 is further coupled to a top surface 112a and a side surface 112b of a corresponding first connection pad 112, so that each first trace 122 is coupled to a corresponding first touch electrode 111. Although the third connection pad 128 shown in FIG. 19A does not cover the first insulating layer 130, it will be understood that, each third connection pad 128 may also cover the first insulating layer 130 while being connected to a top surface 112a and a side surface 112b of a corresponding first connection pad 112. In this way, it may also be possible to realize that each third connection pad 128 is coupled to a corresponding first touch electrode 111.

Figure 19B:
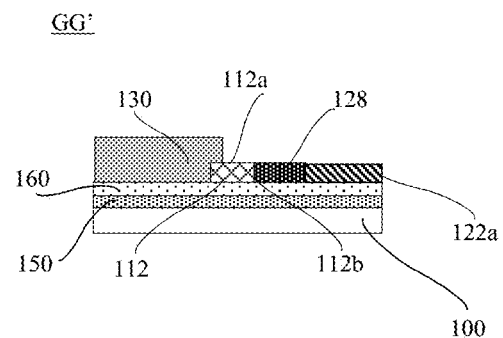
Figure 20A:
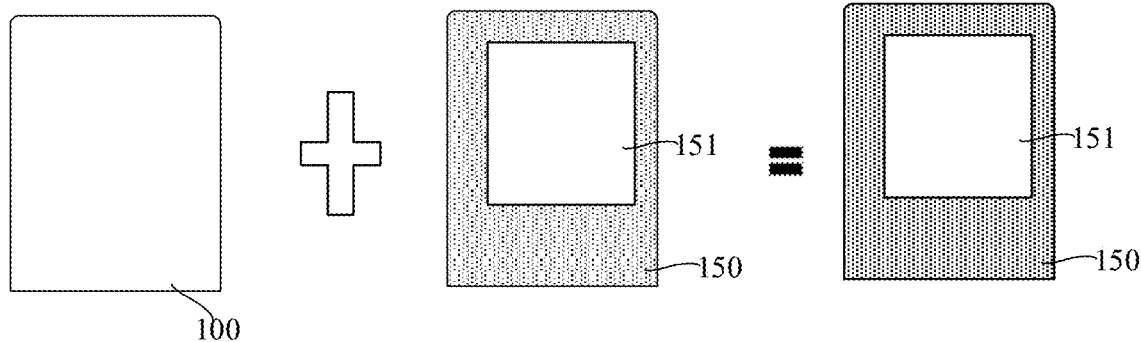
FIGS. 20A~20F are process flow diagrams, in accordance with some embodiments.
Figure 20B:
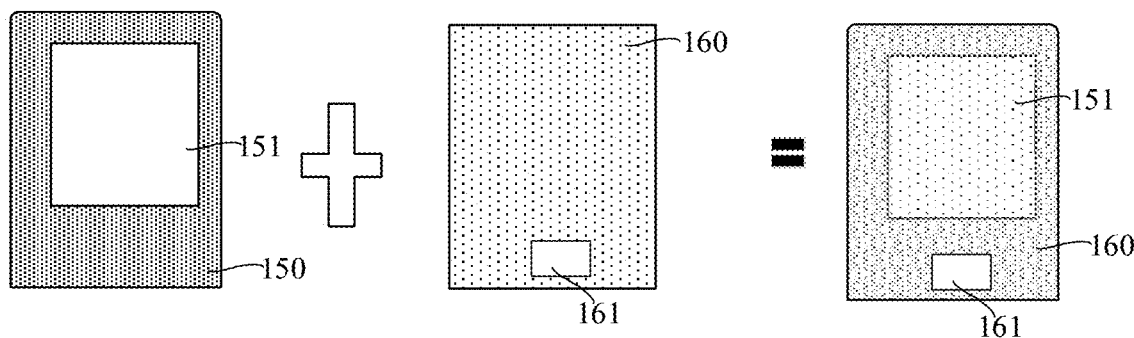
Figure 20C:
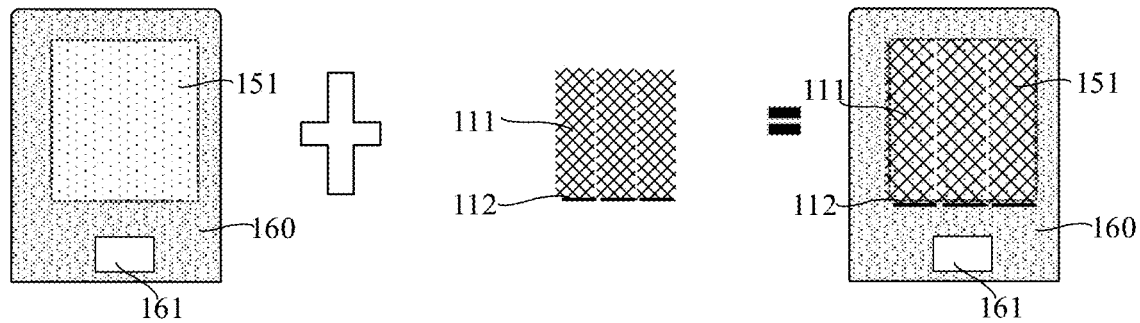
Figure 20D:
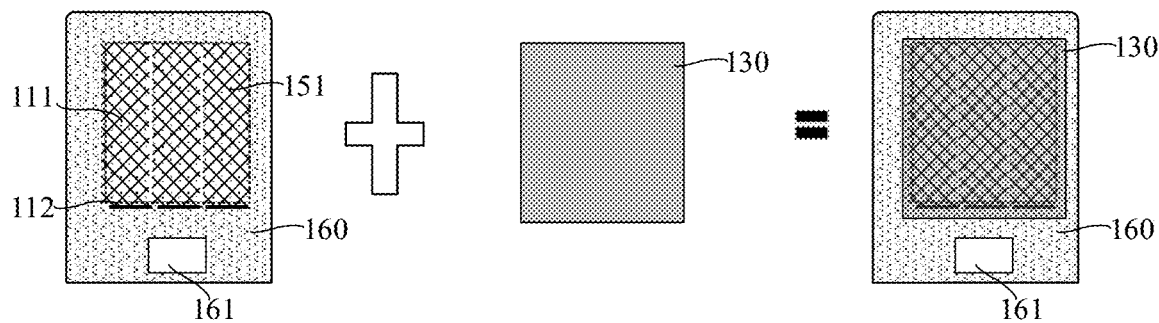
Figure 20E:
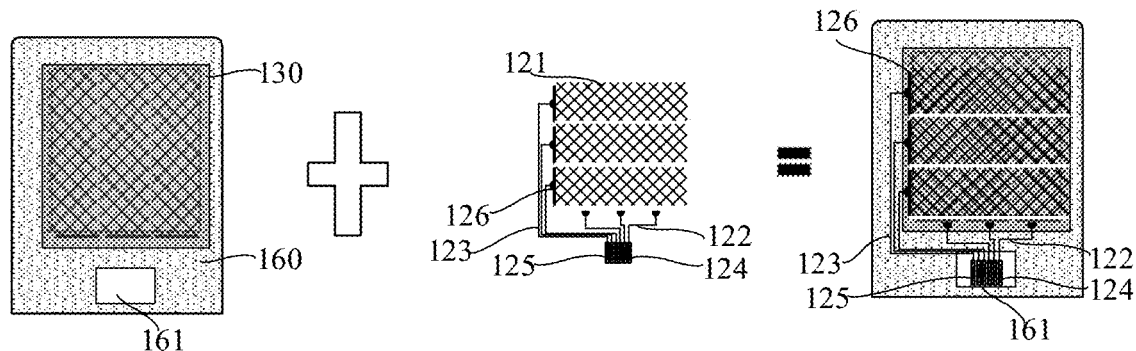
Figure 20F:
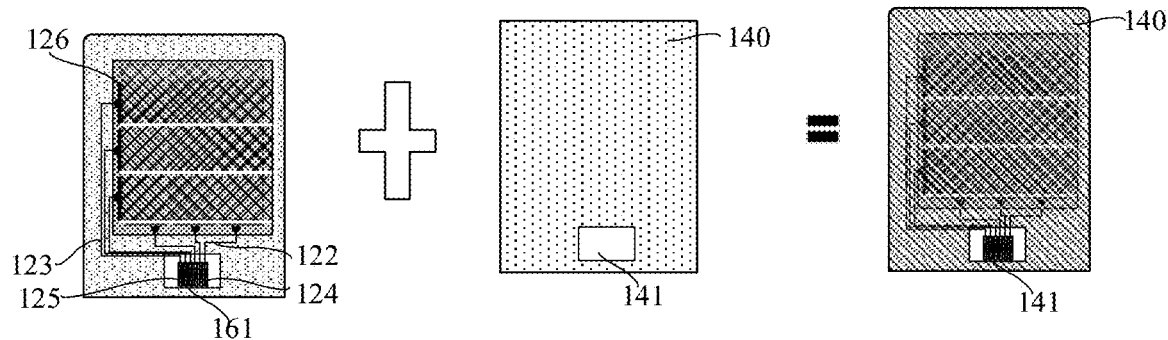

For example, as shown in FIG. 19B, one end of each third connection pad 128 is coupled to a first end 122a of a corresponding first trace 122, and the other end of each third connection pad 128 is directly connected to a side surface 112b of a corresponding first connection pad 112, so that each first trace 122 is coupled to a corresponding first touch electrode 111.

In some embodiments of the present disclosure, as shown in FIGS. 2~4 and 9, the touch pad 1 may further include a second insulating layer 140 disposed on the base 100. The second insulating layer 140 is located on a side of a whole formed by the first conductive pattern layer 130, the first insulating layer 130 and the second conductive pattern layer 120 away from the base 100. For example, in a case where the first conductive pattern layer 110 is more proximate to the base 100 than the second conductive pattern layer 120, the second insulating layer 140 is located on a side of the second conductive pattern layer 120 away from the base 100, and is in contact with the second conductive pattern layer 120. That is, the two are adjacent layers.

A first opening 141 is provided in the second insulating layer 140. The first opening 141 exposes the first bonding pad 124 and the second bonding pad 125, so that the FPC may be bonded with the first bonding pad 124 and the second bonding pad 125 through the first opening 141. Therefore, a region defined by the first opening 141 may be referred to as a bonding region. In some embodiments, orthographic projections of outer edges of the second insulating layer 140 on the base 100 coincides with edges of the base 100.

In some embodiments of the present disclosure, as shown in FIGS. 2~4 and 10, the touch pad 1 further includes a light-shielding layer 150. The light-shielding layer 150 is located between the base 100 and the whole formed by the first conductive pattern layer 110, the first insulating layer 130 and the second conductive pattern layer 120. A second opening 151 is provided in the light-shielding layer 150, and an orthographic projection of the first touch electrode 111 on the light-shielding layer 150 and an orthographic projection of the second touch electrode 121 on the light-shielding layer 150 both overlap with the second opening 151. For example, referring to FIGS. 10 and 12~13, an orthographic projection of the second opening 151 on the base 100 is located within a contour line of an orthographic projection of a whole formed by the at least one first touch electrode 111 on the base 100. Similarly, the orthographic projection of the second opening 151 on the base 100 is located within a contour line of an orthographic projection of a whole formed by the at least one second touch electrode 121 on the base 100. The contour line of the orthographic projection of the whole formed by the at least one first touch electrode 111 on the base 100 is indicated by dashed lines in FIGS. 12~13. The contour line of the orthographic projection of the whole formed by the at least one second touch electrode 121 on the base100 coincides with the contour line of the orthographic projection of the whole formed by the at least one first touch electrode 111 on the base 100. A region defined by the second opening 151 may be referred to as a view area (VA). The orthographic projection of the second opening 151 on the base 100 is indicated by solid lines inside the dashed lines in FIGS. 12~13.

Outer edges of the light-shielding layer 150 may coincide with the edges of the base 100. In addition, the light-shielding layer 150 may be made of a black matrix (BM) material, such as black resin. For example, in a case where the cover plate 1003 is used as the base 100 of the touch pad 1, the light-shielding layer 150 is directly disposed on the cover plate 1003.

In some other embodiments of the present disclosure, in a case where the plurality of film layers (such as the first conductive pattern layer 110, the first insulating layer 130, and the second conductive pattern layer 120) are directly formed on the display surface of the display panel 2 (such as the encapsulation layer 203 of the display panel 2) in sequence to form the touch pad 1, the touch pad 1 may not include the light-shielding layer 150. The light-shielding layer 150 may be disposed on the cover plate 1003 of the touch display device 1000.

In some embodiments of the present disclosure, referring to FIGS. 2~4 and 9, the touch pad 1 further includes a third insulating layer 160. The third insulating layer 160 is located on a side of the light-shielding layer 150 away from the base 100, and located on a side of the whole formed by the first conductive pattern layer 110, the second conductive pattern layer 120 and the first insulating layer 130 proximate to the base 100. An orthographic projection of the third insulating layer 160 on the base 100 coincides with (i.e., almost completely overlap with) an orthographic projection of the second insulating layer 140 on the base 100. That is, a third opening 161 having the same shape, size and position as the first opening 141 is provided in the third insulating layer 160. In this case, if the third insulating layer 160 and the second insulating layer 140 are both formed by a patterning process using a mask, since patterns of the third insulating layer 160 and the second insulating layer 140 are almost identical, the third insulating layer 160 and the second insulating layer 140 may be formed by using a same mask. In this way, the number of masks may be reduced, and a purpose of reducing production costs may be achieved.

Figure 11:
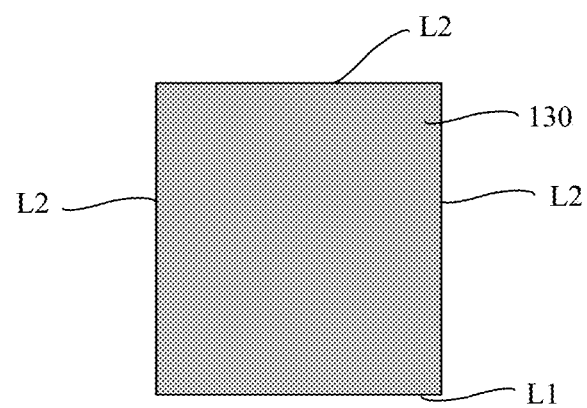
FIG. 11 is a structural diagram of a first insulating layer, in accordance with some embodiments.
Figure 12:
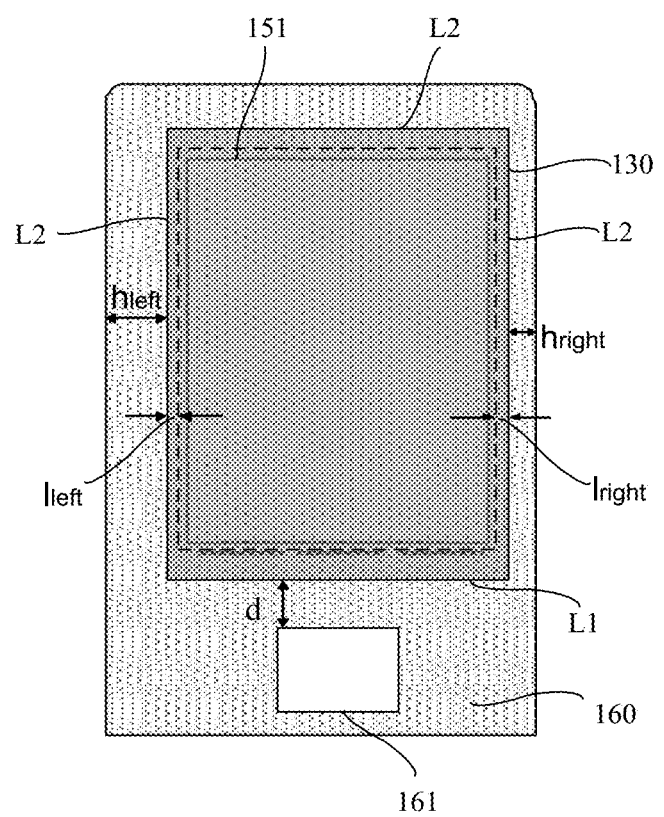
FIG. 12 is a structural diagram of a first insulating layer and a third insulating layer, in accordance with some embodiments.
Figure 13:
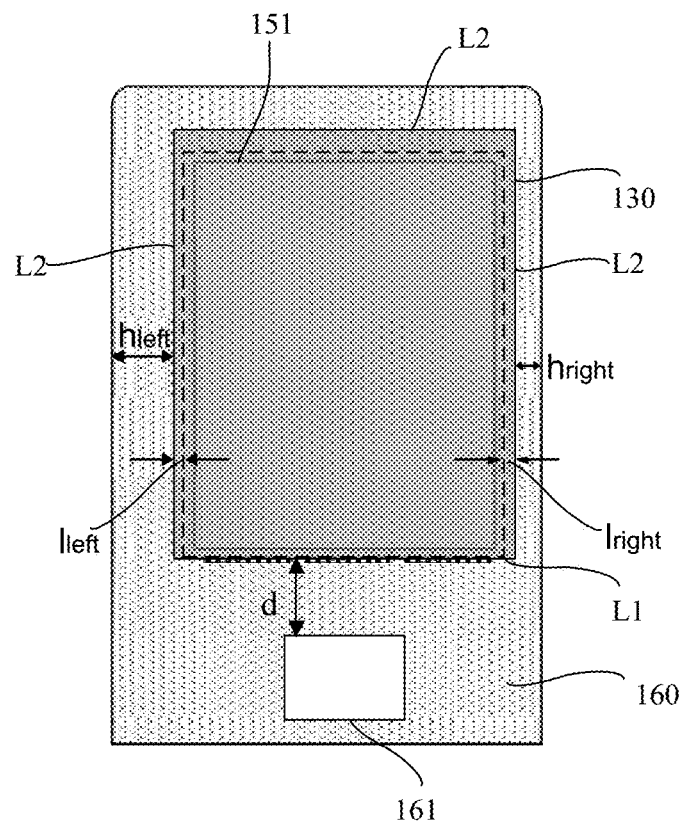
FIG. 13 is another structural diagram of a first insulating layer and a third insulating layer, in accordance with some embodiments.

In some embodiments of the present disclosure, referring to FIGS. 2~4 and 11~13, an orthographic projection (indicated by dotted lines in FIGS. 12~13) of the whole formed by the at least one first touch electrode 111 on the first insulating layer 130 is located within the first insulating layer 130, so that the at least one first touch electrode 111 is blocked by the first insulating layer 130, and will not be in electrical contact with the at least one second touch electrode 121. The first insulating layer 130 has a first edge L1 and second edges L2. The first edge L1 is an edge of the first insulating layer 130 most proximate to a lower edge of the base 100. The lower edge of the base 100 refers to an edge of the base 100 proximate to the bonding region. For example, the first edge L1 is located between an orthographic projection of the first opening 141 on the first insulating layer 130 and the orthographic projection of the whole formed by the at least one first touch electrode 111 on the first insulating layer 130. In FIGS. 12~13, a contour line of the orthographic projection of the whole formed by the at least one first touch electrode 111 on the first insulating layer 130 is indicated by a dashed box. For example, a distance d between the first edge L1 and the first opening 141 is greater than 0.5 mm.

As shown in FIG. 12, the first edge L1 is located below an edge of the first touch electrode 111 proximate to the first opening 141 (i.e., a lower edge of the dashed box in FIG. 12). Or, as shown in FIG. 13, the first edge L1 coincides with an edge of the at least one first touch electrode 111 proximate to the first opening 141 (i.e., a lower edge of the dashed box in FIG. 13). The first insulating layer 130 may be a planar insulating layer as shown in FIG. 11, which has only one closed contour line and has no opening inside. For example, the first insulating layer 130 may have an rectangular shape as shown in FIG. 11.

Figure 6:
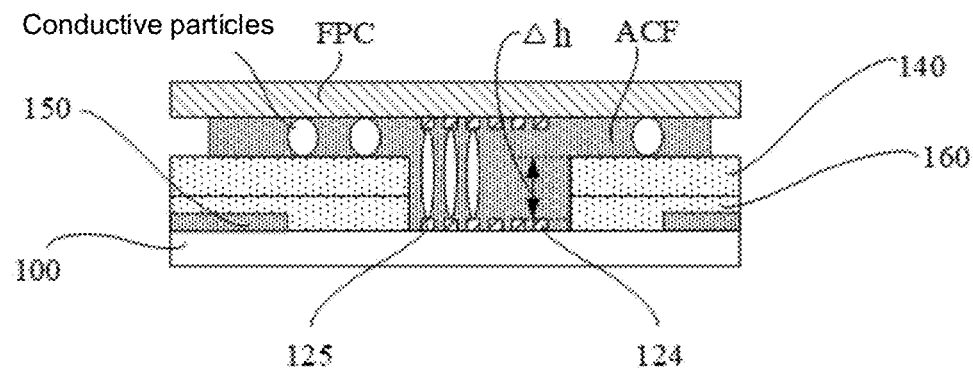
FIG. 6 is a structural diagram of a touch display device, in accordance with some embodiments.

It will be understood that, the first bonding pad 124 and the second bonding pad 125 are arranged in the bonding region (an region where the first opening 141 and the third opening 161 overlap). The FPC is generally coupled to the first bonding pad 124 and the second bonding pad 125 through an anisotropic conductive film (ACF). Due to the existence of the first opening 141 and the third opening 161, as shown in FIGS. 4 and 6, there is a distance difference between the second insulating layer 140 and the first bonding pad 124 or the second binding pad 125. The distance difference is a step difference Δh.

The larger the step difference, the larger the difference between compression degrees by which the conductive particles in the ACF are compressed in the bonding region and in a non-bonding region. As shown in FIG. 6, a compression degree by which the conductive particles in the ACF are compressed in the bonding region is small, and a compression degree by which the conductive particles in the ACF are compressed in the non-bonding region is large. The conductive particles in the non-bonding region will recover after coating, and will recover to a relatively large extent. As a result, the conductive particles in the bonding region may not be able to electrically connect the FPC to the first bonding pad 124 and the second bonding pad 125 effectively, thereby increasing a probability of FPC bonding failure. In order to ensure a good connection, the step difference needs to be reduced as much as possible.

In a comparative embodiment, assuming that the first insulating layer 130 and the second insulating layer 140 are also formed by using a same mask, a depth of an opening formed in the bonding region (the region where the first opening 141 and the third opening 161 overlap) is a sum of thicknesses of the first insulating layer 130, the second insulating layer 140 and the third insulating layer 160 (for example, the sum of the thicknesses of the three insulating layers is 5 μm to 7 μm). However, in some embodiments of the present disclosure, referring to FIG. 4, a depth of an opening formed in the bonding region is a sum of thicknesses of the second insulating layer 140 and the third insulating layer 160, which makes the step difference smaller. The step difference is approximately 2 μm smaller than that in the comparative embodiment. Correspondingly, the probability of FPC bonding failure is also smaller, and a bonding effect between the FPC and the first bonding pad 124 and the second bonding pad 125 is better.

In some embodiments of the present disclosure, as shown in FIGS. 2 and 11~13, edges of the first insulating layer 130 in addition to the first edge L1 are all second edges L2. That is, there are three second edges L2. There is a first distance h between at least one (for example, each) of the second edges L2 and at least one corresponding edge of the base 100; or at least one (for example, each) of the second edges L2 coincides with at least one corresponding edge of the base 100. The first distances h between different second edges L2 and corresponding edges of the base 100 may be the same or different. For example, a distance $h_{left}$ between a second edge L2 on the left and a left edge of the base 100 is greater than a distance $h_{right}$ between a second edge L2 on the right and a right edge of the base 100. In addition, the second edges L2 are located outside the contour line (indicated by the dashed box in FIGS. 12~13) of the orthographic projection of the whole formed by the at least one first touch electrode 111 on the first insulating layer 130, and there is a second distance between the two. The second distances corresponding to different second edges L2 may be the same or different. For example, a second distance $I_{left}$ exists between the second edge L2 on the left and a left edge of the whole formed by the at least one first touch electrode 111. A second distance $I_{right}$ exists between the second edge L2 on the right and a right edge of the whole formed by the at least one first touch electrode 111. $I_{left}$ and $I_{right}$ may be the same or different. For example, the second distance is in a range of 0.5 mm~4 mm.

In the production of touch pads, the production of a certain type of touch pads is usually established as a production project, and the same production project uses a corresponding set of masks. At least one size or position of the outside dimensions (OD, referring to outer contours of the base 100), view areas or bonding regions of products produced by different production projects is not the same. Therefore, the masks cannot be used in different production projects.

However, in some embodiments of the present disclosure, since the first conductive pattern layer 110 does not include bonding pads or traces, a structure of the first conductive pattern layer 110 will not be affected when a position or size of the bonding region changes. Therefore, the first conductive pattern layer 110 is able to adapt to changes in the position and size of the bonding region. In addition, along the extending direction of the first touch electrode 111 in the first conductive pattern layer 110, the first touch electrode 111 may exceed the view area by a certain distance. For example, the first touch electrode 111 may exceed the view area at both an upper side and a lower side by 0.5 mm to 4 mm. When the size or position of the view area changes, the first conductive pattern layer 110 may still completely cover the view area. Therefore, the first conductive pattern layer 110 is able to adapt to changes in the size or position of the view area to a certain extent.

Similarly, since the first insulating layer 130 only covers the first conductive pattern layer 110, the first insulating layer 130 may also be able to adapt to changes in the position and size of the bonding region. In addition, the first insulating layer 130 needs to be arranged to exceed beyond the whole formed by the at least one first touch electrode 111 in the first conductive pattern layer 110 by a certain distance; that is, the first insulating layer 130 needs to be expanded by a certain distance. Therefore, similarly, the first insulating layer 130 may also be able to adapt to changes in the size or position of the view area to a certain degree.

In this way, in some embodiments of the present disclosure, the masks used in fabricating the first conductive pattern layer 110 and the first insulating layer 130 may be applied to a plurality of different production projects, thereby reducing production costs.

Some embodiments of the present disclosure further provide a method for manufacturing the touch pad 1. In some embodiments of the present disclosure, as shown in FIGS. 20A~20F, the method for manufacturing the touch pad 1 includes steps 101~106 (S101~S106).

In S101, a light-shielding layer 150 is formed on a base 100. A second opening 151 is provided in the light-shielding layer 150.

For example, an orthographic projection of a first touch electrode 111 to be formed later on the light-shielding layer 150 and an orthographic projection of a second touch electrode 121 to be formed later on the light-shielding layer 150 both overlap with the second opening 151. That is, both the first touch electrode 111 and the second touch electrode 121 are exposed from the second opening 151. Patterns of the light-shielding layer 150 are formed by a single patterning process. The light shielding layer 150 may be made of ink or resin materials.

In S102, a third insulating layer 160 is formed on the base 100 where the light-shielding layer has been formed. A third opening 161 is provided in the third insulating layer 160.

For example, orthographic projections of outer edges of the third insulating layer 160 on the base 100 coincide with the edges of the base 100. A region defined by the third opening 161 may be referred to as a bonding region. The third insulating layer 160 is a light-transmitting film layer, and may be made of silicon nitride or silicon oxide.

In S103, a first conductive pattern layer 110 is formed on the base 100 where the first insulating film 160 has been formed.

For example, the first conductive pattern layer 110 includes at least one first touch electrode 111 extending in a first direction X. For example, the first conductive pattern layer 110 may include a plurality of (e.g., three, as shown in FIG. 5A) first touch electrodes 111, and there is a gap between two adjacent first touch electrodes 111. A material of the first conductive pattern layer 110 is not limited herein. The first conductive pattern layer 110 may include one pattern layer, or at least two pattern layers that are stacked, orthographic projections of which on the base 100 coinciding with each other.

In S104, a first insulating layer 130 is formed on the base 100 where the first conductive pattern layer 110 has been formed.

For example, an orthographic projection of a whole formed by the at least one first touch electrode 111 on the base 100 is located within an orthographic projection of the first insulating layer 130 on the base 100. The first insulating layer 130 may be a planar insulating layer as shown in FIG. 11, which has only one closed contour line and has no opening inside. The first insulating layer 130 is a light-transmitting film layer, and may be made of, for example, silicon nitride or silicon oxide.

In S05, a second conductive pattern layer 120 is formed on the base 100 where the first insulating layer 130 has been formed.

For example, the second conductive pattern layer 120 includes at least one second touch electrode 121 extending in a second direction Y. For example, the second conductive pattern layer 120 may include a plurality of second touch electrodes 121, and there is a gap between two adjacent second touch electrodes 121. The first direction and the second direction are two directions in a plane where the touch pad 1 is located. An angle between the first direction and the second direction is greater than 0° and less than 180°. For other configurations of the second touch electrode 121 except for the extending direction thereof, reference may be made to the description of the first touch electrode 111 above, and details will not be repeated here. The second conductive pattern layer 120 further includes at least one (for example, a plurality of) first trace 122, at least one (for example, a plurality of) second trace 123, and at least one (for example, a plurality of) first bonding pad 124 and at least one (for example, a plurality of) second bonding pad 125.

One end of each first trace 122 is coupled to a corresponding first touch electrode 111, and the other end of each first trace 122 is coupled to a corresponding first bonding pad 124. One end of each second trace 123 is connected to a corresponding second touch electrode 121, and the other end of each second trace 123 is coupled to a corresponding second bonding pad 125.

In S106, a second insulating layer 140 is formed on the base 100 where the second conductive pattern layer 120 has been formed. A first opening 141 is provided in the second insulating layer 140.

For example, orthographic projections of outer edges of the second insulating layer 140 on the base 100 coincide with the edges of the base 100. A region defined by the first opening 141 may be referred to as a bonding region. The second insulating layer 140 is a light-transmitting film layer, and may be made of silicon nitride or silicon oxide. An orthographic projection of the second insulating layer 140 on the base 100 and an orthographic projection of the third insulating layer 160 on the base 100 completely overlap with each other. The third insulating layer 160 and the second insulating layer 140 may be fabricated by using a same mask.

As for the materials and shapes of all layers fabricated by the method described above and a positional relationship between the layers, reference may be made to the description of the touch pad above.

It will be noted that, in the method for manufacturing the touch pad 1 described above, S101, S102 and S106 are not essential. That is to say, in some embodiments, the method for manufacturing the touch pad 1 may only include S103~S105. On this basis, in some embodiments, the method for manufacturing the touch pad 1 may include at least one of S101, S102 and S106.

The foregoing descriptions are merely specific implementations of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A touch pad, comprising:
   a first conductive pattern layer, the first conductive pattern layer including a first touch electrode extending in a first direction and a first connection pad located at an end of the first touch electrode;
   a second conductive pattern layer, the second conductive pattern layer including a second touch electrode extending in a second direction and a second connection pad located at an end of the second touch electrode;

a first trace, a second trace, a first bonding pad, and a second bonding pad that are located together in the first conductive pattern layer or in the second conductive pattern layer, a first end of the first trace being coupled to the first touch electrode through the first connection pad, a second end of the first trace being coupled to the first bonding pad, a first end of the second trace being coupled to the second touch electrode through the second connection pad, and a second end of the second trace being coupled to the second bonding pad; and a first insulating layer located between the first conductive pattern layer and the second conductive pattern layer, the first insulating layer being configured to insulate the first touch electrode and the second touch electrode from each other, wherein the first direction intersects the second direction;

an orthographic projection of a whole formed by the first touch electrode and the second touch electrode on the first insulating layer is located within the first insulating layer;

the first insulating layer has a first edge and second edges, the second edges being remaining edges of the first insulating layer except for the first edge; and the first edge is located between an orthographic projection of a whole formed by the first bonding pad and the second bonding pad on the first insulating layer and an orthographic projection of the whole formed by the first touch electrode and the second touch electrode on the first insulating layer; or the first edge coincides with an edge of the whole formed by the first touch electrode and the second touch electrode proximate to the whole formed by the first bonding pad and the second bonding pad.

2. The touch pad according to claim 1, wherein a material of the first conductive pattern layer is different from a material of the second conductive pattern layer.

3. The touch pad according to claim 1, wherein in a case where the first edge is located between the orthographic projection of the whole formed by the first bonding pad and the second bonding pad on the first insulating layer and the orthographic projection of the whole formed by the first touch electrode and the second touch electrode on the first insulating layer, an orthographic projection of the first connection pad on the first insulating layer is located within the first insulating layer;

a via hole is provided in the first insulating layer, and the first end of the first trace is coupled to a surface of the first connection pad exposed from the via hole through the via hole.

4. The touch pad according to claim 3, wherein the first connection pad includes a top surface proximate to the first insulating layer and a side surface connected to the top surface;

the top surface is exposed from the via hole, and the first end of the first trace is coupled to the top surface.

5. The touch pad according to claim 1, wherein in a case where the first edge coincides with the edge of the whole formed by the first touch electrode and the second touch electrode proximate to the whole formed by the first bonding pad and the second bonding pad, an orthographic projection of the first connection pad on the first insulating layer partially overlaps with the first insulating layer, and a portion of the first connection pad is exposed outside of the first insulating layer; the first end of the first trace is coupled to the portion of the first connection pad that is exposed.

6. The touch pad according to claim 5, wherein the first connection pad includes a top surface proximate to the first insulating layer and a side surface connected to the top surface;

the side surface is exposed outside of the first insulating layer, and the first end of the first trace is coupled to the side surface; or, the side surface and at least a portion of the top surface are exposed outside of the first insulating layer, and the first end of the first trace is coupled to the side surface and the portion of the top surface that are exposed.

7. The touch pad according to claim 6, wherein the second conductive pattern layer further includes a third connection pad;

one end of the third connection pad is coupled to the first end of the first trace, and another end of the third connection pad is coupled to the side surface that is exposed; or, one end of the third connection pad is coupled to the first end of the first trace, and another end of the third connection pad is coupled to the side surface and the portion of the top surface that are exposed.

8. The touch pad according to claim 1, further comprising a second insulating layer, wherein the second insulating layer is located on a side of the second conductive pattern layer away from the first conductive pattern layer; a first opening is provided in the second insulating layer, and the first opening exposes the first bonding pad and the second bonding pad.

9. The touch pad according to claim 8, further comprising a third insulating layer, wherein the third insulating layer is located on a side of the first conductive pattern layer away from the second conductive pattern layer; a third opening is provided in the third insulating layer, and the third opening exposes the first bonding pad and the second bonding pad; and an orthographic projection of the third insulating layer on the first insulating layer coincides with an orthographic projection of the second insulating layer on the first insulating layer.

10. The touch pad according to claim 9, further comprising a light-shielding layer, wherein the light-shielding layer is located on a side of the third insulating layer away from the first conductive pattern layer; a second opening is provided in the light-shielding layer, and an orthographic projection of the first touch electrode on the light-shielding layer and an orthographic projection of the second touch electrode on the light-shielding layer both overlap with the second opening.

11. The touch pad according to claim 10, wherein a contour line of the orthographic projection of the first touch electrode on the light-shielding layer exceeds beyond the second opening by 0.5 mm to 4 mm in the first direction; and a contour line of the orthographic projection of the second touch electrode on the light-shielding layer exceeds beyond the second opening by 0.5 mm to 4 mm in the second direction.

12. The touch pad according to claim 1, wherein the first touch electrode includes a plurality of first touch electrode lines and a plurality of second touch electrode lines, and the plurality of first touch electrode lines and the plurality of second touch electrode lines intersect to form the first touch electrode having a plurality of openings;

the second touch electrode includes a plurality of first touch electrode lines and a plurality of second touch electrode lines, and the plurality of first touch electrode lines and the plurality of second touch electrode lines intersect to form the second touch electrode having a plurality of openings.

13. The touch pad according to claim 1, wherein
the first conductive pattern layer includes a first metal layer and a first blackened layer that are stacked, and the first blackened layer is located on a side of the first metal layer proximate to a touch surface of the touch pad;
and/or,
the second conductive pattern layer includes a second metal layer and a second blackened layer that are stacked, and the second blackened layer is located on a side of the second metal layer proximate to the touch surface of the touch pad.

14. The touch pad according to claim 1, further comprising a base substrate, wherein
the first conductive pattern layer, the second conductive pattern layer and the first insulating layer are all located on the base substrate; and
the first conductive pattern layer is more proximate to the base substrate than the second conductive pattern layer.

15. The touch pad according to claim 14, wherein the first insulating layer has a first edge and second edges, the second edges being remaining edges of the first insulating layer except for the first edge;
a first distance exists between the second edge and a corresponding edge of the base substrate, or, the second edge coincides with a corresponding edge of the base substrate;
the second edge is located outside a contour line of the orthographic projection of the whole formed by the first touch electrode and the second touch electrode on the first insulating layer, and a second distance exists between the second edge and the contour line.

16. The touch pad according to claim 15, wherein the second distance is in a range of 0.5 mm to 4 mm.

17. A touch display device, comprising a display panel and the touch pad according to claim 1.

18. A method for manufacturing a touch pad, comprising:
forming a first conductive pattern layer, the first conductive pattern layer including a first touch electrode extending in a first direction and a first connection pad located at an end of the first touch electrode;
forming a second conductive pattern layer, the second conductive pattern layer including a second touch electrode extending in a second direction and a second connection pad located at an end of the second touch electrode;
forming a first trace, a second trace, a first bonding pad and a second bonding pad together in the first conductive pattern layer or in the second conductive pattern layer; and
forming a first insulating layer between the first conductive pattern layer and the second conductive pattern layer, the first insulating layer being configured to insulate the first touch electrode and the second touch electrode from each other, wherein
the first direction intersects the second direction; a first end of the first trace is coupled to the first touch electrode through the first connection pad, and a second end of the first trace is coupled to the first bonding pad; a first end of the second trace is coupled to the second touch electrode through the second connection pad, and a second end of the second trace is coupled to the second bonding pad;
an orthographic projection of a whole formed by the first touch electrode and the second touch electrode on the first insulating layer is located within the first insulating layer;
the first insulating layer has a first edge and second edges, the second edges being remaining edges of the first insulating layer except for the first edge; and
the first edge is located between an orthographic projection of a whole formed by the first bonding pad and the second bonding pad on the first insulating layer and an orthographic projection of the whole formed by the first touch electrode and the second touch electrode on the first insulating layer; or
the first edge coincides with an edge of the whole formed by the first touch electrode and the second touch electrode proximate to the whole formed by the first bonding pad and the second bonding pad.

* * * * *